United States Patent
Tang et al.

(10) Patent No.: US 10,108,300 B2
(45) Date of Patent: Oct. 23, 2018

(54) BOOTSTRAPPED AND CORRELATED DOUBLE SAMPLING (BCDS) NON-CONTACT TOUCH SENSOR FOR MOBILE DEVICES

(71) Applicant: THE REGENTS OF THE UNIVERSITY OF CALIFORNIA, Oakland, CA (US)

(72) Inventors: Adrian J. Tang, Pasadena, CA (US); Mau-Chung Frank Chang, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 72 days.

(21) Appl. No.: 15/262,936

(22) Filed: Sep. 12, 2016

(65) Prior Publication Data
US 2017/0060342 A1 Mar. 2, 2017

Related U.S. Application Data

(63) Continuation of application No. PCT/US2015/020577, filed on Mar. 13, 2015.
(Continued)

(51) Int. Cl.
*G06F 3/044* (2006.01)
*H03K 17/955* (2006.01)
(Continued)

(52) U.S. Cl.
CPC ............ *G06F 3/0418* (2013.01); *G06F 3/044* (2013.01); *H03K 3/0315* (2013.01);
(Continued)

(58) Field of Classification Search
CPC .......... G06F 3/17; G06F 3/0418; G06F 3/041; G06F 3/044; G06F 3/0416;
(Continued)

(56) References Cited

U.S. PATENT DOCUMENTS 5,442,671 A * 8/1995 Wollschlager ....... G01D 5/2013
324/207.11
7,888,715 B2 2/2011 Ahn et al.
(Continued)

FOREIGN PATENT DOCUMENTS

JP 2009-200681 A 9/2009
JP 2009-289235 A 12/2009
(Continued)

OTHER PUBLICATIONS

Korean Intellectual Property Office (KIPO), International Search Report and Written Opinion, PCT International Application No. PCT/US2015/020577 dated Jun. 26, 2015, pp. 1-14, with claims searched, pp. 15-22.

(Continued)

*Primary Examiner* — Dismery Mercedes
(74) *Attorney, Agent, or Firm* — O'Banion & Ritchey LLP; John P. O'Banion

(57) ABSTRACT

Non-contact position and motion sensing is improved for oscillator frequency based sensors in response to adding a two phase calibration along with bootstrapping circuit. Calibration is performed across the multiple sensor channels, so that: (1) maximum sensor channel loading is determined, and (2) the amount of capacitive load required for each other channel to match this same maximum load is stored for application to that channel during non-contact sensing. Capacitive coupling between channels is nullified by a bootstrapping process, in which time-domain voltage on the active channel is replicated on the non-active channels during non-contact sensing, thus creating equal potentials across inter-channel couplings that effectively eliminate inter-channel capacitive loading.

13 Claims, 18 Drawing Sheets

Related U.S. Application Data

(60) Provisional application No. 62/067,968, filed on Oct. 23, 2014, provisional application No. 61/953,004, filed on Mar. 14, 2014.

(51) Int. Cl.
*G06F 3/041* (2006.01)
*H03K 3/03* (2006.01)

(52) U.S. Cl.
CPC . *H03K 17/955* (2013.01); *G06F 2203/04101* (2013.01); *G06F 2203/04108* (2013.01); *H03K 2217/94026* (2013.01); *H03K 2217/960715* (2013.01)

(58) Field of Classification Search
CPC . G06F 2203/04101; G06F 2203/04108; G06F 1/3231; H03K 17/962; H03K 17/955; H03K 3/0315; H03K 2217/94026
See application file for complete search history.

(56) References Cited

U.S. PATENT DOCUMENTS

| | | | | |
|---|---|---|---|---|
| 8,089,522 B2* | 1/2012 | Choi | ............... | H04N 3/155 348/206 |
| 8,094,133 B2* | 1/2012 | Sato | ............... | G06F 3/044 345/173 |
| 8,421,437 B2 | 4/2013 | Levine | | |
| 8,493,360 B2* | 7/2013 | Kremin | ............... | G06F 3/0416 178/18.06 |
| 8,816,973 B2* | 8/2014 | Mizuhashi | ............... | G06F 1/32 345/156 |
| 8,933,907 B2* | 1/2015 | Hanauer | ............... | G06F 3/0416 345/173 |
| 8,963,843 B2* | 2/2015 | Ningrat | ............... | G06F 3/044 178/18.01 |
| 9,164,629 B2* | 10/2015 | Soo | ............... | G06F 3/044 |
| 9,632,644 B2* | 4/2017 | Han | ............... | G06F 3/0416 |
| 9,806,608 B2* | 10/2017 | Yao | ............... | H02M 3/07 |
| 2004/0222801 A1 | 11/2004 | Becker et al. | | |
| 2007/0074913 A1* | 4/2007 | Geaghan | ............... | G06F 3/044 178/18.06 |
| 2008/0122458 A1* | 5/2008 | Lenz | ............... | H03K 17/955 324/687 |
| 2010/0066693 A1 | 3/2010 | Sato et al. | | |
| 2010/0073323 A1 | 3/2010 | Geaghan | | |
| 2018/0088735 A1* | 3/2018 | Lin | ............... | G06F 3/0418 |

FOREIGN PATENT DOCUMENTS

| | | |
|---|---|---|
| KR | 10-2005-0054841 A | 6/2005 |
| KR | 10-2006-0108558 A | 10/2006 |
| KR | 10-0797606 B1 | 1/2008 |
| KR | 10-1000627 B1 | 12/2010 |
| WO | 2015/121303 A1 | 8/2015 |
| WO | 2015/124564 A1 | 8/2015 |

OTHER PUBLICATIONS

Dimitrov, Deyan Levski, "A Cyclic Analog to Digital Converter for CMOS image sensors", Department of Electrical Engineering, Linkopings universitet, Sweden, Jun. 12, 2013, 129 pages.

Waltari, Mikko, "Circuit Techniques for Low-Voltage and High Speed A/D Converters", Helsinki University of Technology, Department of Electrical and Communications Engineering, Electronic Circuit Design Laboratory, Report 33, Espoo 2002, 286 pages.

* cited by examiner

BOOTSTRAPPED AND CORRELATED DOUBLE SAMPLING (BCDS) NON-CONTACT TOUCH SENSOR FOR MOBILE DEVICES

CROSS-REFERENCE TO RELATED APPLICATIONS

This application is a 35 U.S.C. § 111(a) continuation of PCT international application number PCT/US2015/020577 filed on Mar. 13, 2015, incorporated herein by reference in its entirety, which claims priority to, and the benefit of U.S. provisional patent application Ser. No. 61/953,004 filed on Mar. 14, 2014, incorporated herein by reference in its entirety, and which also claims priority to, and the benefit of and U.S. provisional patent application Ser. No. 62/067,968 filed on Oct. 23, 2014, incorporated herein by reference in its entirety. Priority is claimed to each of the foregoing applications.

The above-referenced PCT international application was published as PCT International Publication No. WO 2015/138984 on Sep. 17, 2015, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technological Field

This technical disclosure pertains generally to non-contact position and motion sensing, and more particularly to a bootstrapped correlated double sampling non-contact position and motion sensing apparatus.

2. Background Discussion

Contactless (3D) touch sensors, when integrated with displays, offer many advantages over that of conventional touch-panel screens which are more hygienic, immersive and interactive human/machine interface for 3D user experiences. While significant progress has been made in developing 3D contactless touch sensors for larger television and monitor type displays, it has yet to be infused into space and battery constrained mobile devices (i.e., tablets and smartphones). Current non-contact displays employ capacitive and charge-based sensors to detect the location of a user finger, of fingers.

For successful insertions into these systems, a paradigm shift in touch-sensor system design is essential to enable seamless sensing operations with smaller size, more tightly spaced, strongly coupled, and highly resistive display electrodes. In addition, any successful 3D sensing solution for mobile devices must consume low power and small silicon area to be compatible with limited battery and space resources.

Accordingly, a need exists for non-contact sensing which provides both increased accuracy and noise-immunity.

BRIEF SUMMARY

The present technology uses an oscillator, counter and a count storage and comparison circuit to more accurately determine the position (motion) of a finger hovering over the display of a portable electronic device, such as a Smartphone. Any portable electronic device with a display can incorporate this technology to provide a 2D or 3D non-contact interface.

Unlike capacitive sensing, using an oscillator provides much higher gain and allows the device to be more sensitive to the position and movement of the user's finger over the touchscreen. This bootstrapping and correlated double sampling (BCDS) sensing apparatus uses a double sampling approach, in which the oscillator first senses the active channel and then senses the reference channel and by subtracting these two results from one another a correlated output is generated. In combination with this is a calibration sequence which assures all channels have the same loading, and bootstrapping which eliminates the effect of loading between channels. By performing the calibration and bootstrapping interoperably with the double sampling technique measurement accuracy is significantly improved. In addition, as a result of these interoperative enhancements, the present technology provides reduced sensitivity to noises, both external and electronic, far beyond what is possible with a conventional electrostatic capacitive sensor.

The disclosed technology can be implemented both with discrete electronics and/or integrated electronics on-chip and can be implemented with either a ring or LC oscillator. The oscillator frequency can be chosen anywhere in the range from approximately 100 MHz to 100 GHz, and more preferably from several hundred MHz, for large scale applications such as wide-screen TVs, up to the 100 GHz range for very small displays including those found in smartphones.

An oscillator based bootstrapping and correlated double sampling (BCDS) sensing apparatus is described having an inverter-based active resonator with its frequency monitored by a digital counter over an integration window for estimating loading capacitance of the oscillator.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only:

DETAILED DESCRIPTION

A. Oscillator Correlated Double Sampling (BCDS) Sensing

The oscillator based bootstrapped and correlated double sampling (BCDS) sensing apparatus disclosed, addresses mobile-specific challenges and facilitates 3D touch sensing in mobile devices.

Figure 1:
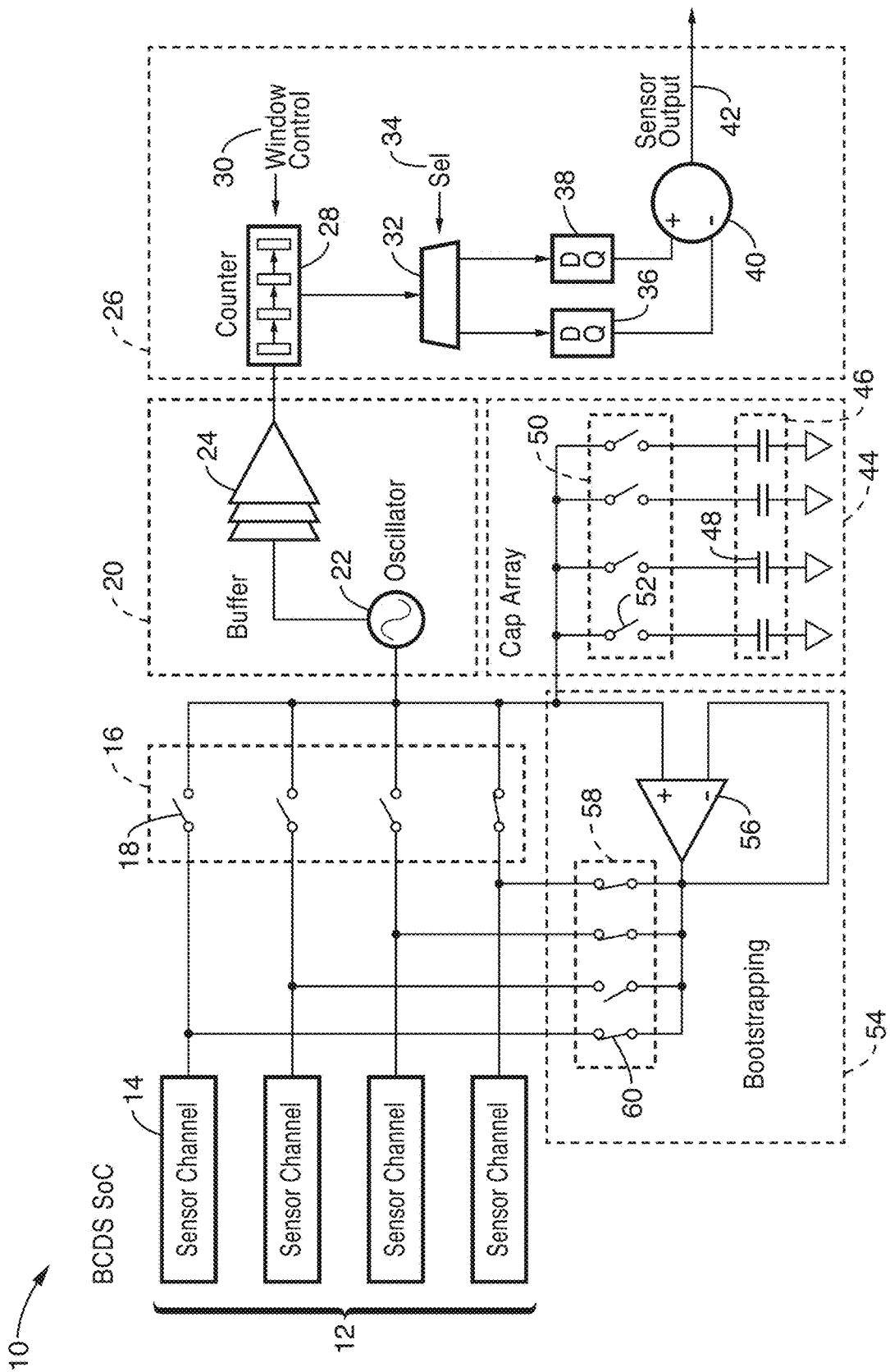
FIG. 1 is a block diagram of an oscillator based bootstrapped and correlated double sampling (BCDS) sensing apparatus according to an embodiment of the present disclosure.

FIG. 1 illustrates an example embodiment 10 of the BCDS apparatus. The BCDS sensor contains an inverter-based active resonator whose frequency is monitored via a digital counter with a specific integration window time to estimate the oscillator's loading capacitance. In particular, the circuit is shown with multiple sensor inputs 12, with each sensor 14 channel coupled through a block of switches 16, so that any sensor channel can be sampled by closing a switch 18, and thus coupling the sensor input to an oscillator block 20, which is depicted comprising an oscillator 22 and a buffer 24. It should be appreciated that the number of sensor inputs is typically determined by the number of touch panel electrodes, which is usually greater than 16.

Output from oscillator 22 is buffered by one or more buffer circuits 24 to a counter block 26. The buffered oscillator signal drives a counter 28, having a plurality of bits (e.g., 16 bits) with its counting period (integration window) controlled by window control signal 30. Counter output is received by count storage and comparison circuitry, which is exemplified in this embodiment with demultiplexer 32, first and second register 36, 38, and a subtractor/comparator. In particular, demultiplexer 32 directs the count signal to either an A or B output side, in response to a selection input 34. These A and B outputs are each coupled to first and second data registers 36, 38, such as comprising data flip-flop (D-FF) registers. The clocking of registers 36, 38, is not shown, but preferably is driven from window control signal 30, which may be modified for propagation delays, which determines counter counting time based on its pulse width. Register outputs are directed to a difference circuit (subtractor or multiple-bit comparator) 40 which outputs a sensor output signal 42.

A capacitor array block 44 comprises multiple parallel capacitors 46, in which each capacitor load 48 is coupled to ground or one supply rail. Each capacitor 48 is connected through a switch 52, within multiple switches 50, as a load upon oscillator 22, and is also coupled to the input of amplifier 56. By way of example and not limitation, this figure depicts using four parallel capacitors, each capable of being selected in response to closing a series switch. Embodiments can be provided with more or fewer capacitors and associated switches without departing from the teachings of present disclosure.

A bootstrapping circuit 54 is also shown having an amplifier 56, exemplified for unity gain, with its non-inverting input receiving the signal from the input of oscillator 22, while its inverting input is coupled to the output. Output from amplifier 56 is coupled through multiple switches 58, each switch 60 therein connecting to one of the sensor channels preceding the group of switches 18. It will be noted that bootstrapping switches 58 are configured to establish connections to every unscanned (inactive) channel, with the bootstrapping switch disconnected from the channel being scanned (active channel). The active channel being scanned is connected through the scanning switches 16 to the oscillator input, and to the input of buffer 56 driving the bootstrap output.

For the sake of clarity of illustration, the drawings do not depict the digital timing and control circuitry for generating various timing and control signals described. It should be appreciated that there are a number of approaches and circuit configurations which may be utilized by one of ordinary skill in the art to generate timing and control signals in controlling the operations described herein.

In normal measurement mode, a user finger hovers (moves) in height and position with respect to the display. The circuit reads each of the sensor channels in-turn (order is not limited to being a particular sequence) and counts the number of oscillator periods within an integration window. The count value for any channel is compared with a reference count and the difference is output as indicative of load capacitance induced by the capacitance of finger positioning. This comparison between measured value and reference provides correlated double sampling (CDS) which increases the accuracy and noise immunity of the system. In at least one example embodiment, the reference is an extra channel that is not wired to the actual touchscreen as the sensor channels are. By way of example and not limitation, the reference may comprise a fixed capacitor located on the printed circuit board (PCB) that has the same capacitance as one touchscreen channel without any user finger in the proximity of the sensor.

FIG. 2A through FIG. 2D and FIG. 3A through FIG. 3D illustrate an embodiment 70 in which the highest load for the channels is determined (FIG. 2A-FIG. 2D) and then the capacitance of each sensing channel is calibrated (FIG. 3A-FIG. 3D) to a reference value using a capacitor array based on a successive approximation register (SAR) principles (runs on startup) toward achieving high sampling accuracy.

During each measurement cycle, the oscillator is first connected to the desired input channel for a given integration time (programmable from 0.1 ms to 100 ms), such as was seen in FIGS. 2A-2D, and then connected to a reference channel with identical capacitance (calibrated by the capacitor array during initialization) for the same integration window, as seen in FIG. 3A-3D.

Figure 2A:
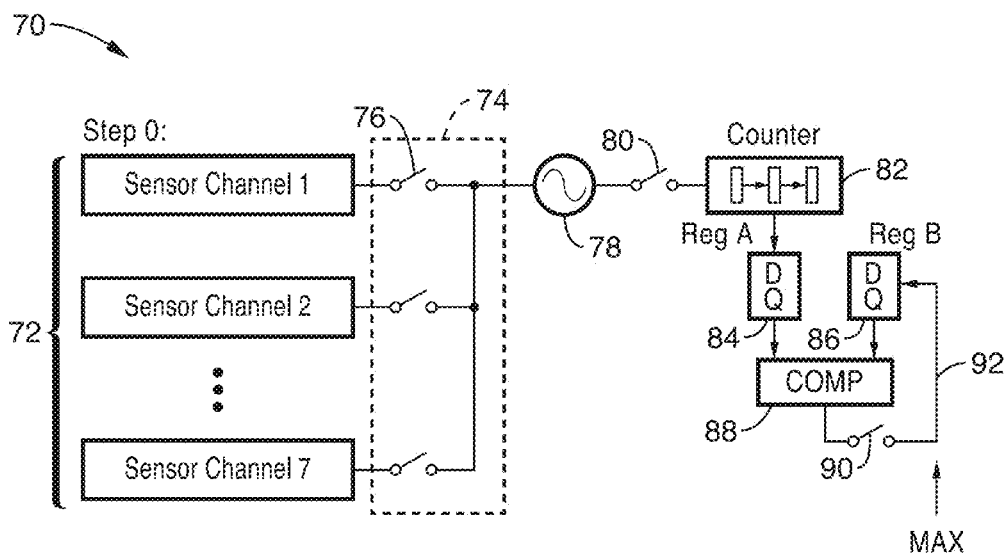
FIG. 2A through FIG. 2D are block diagrams of BCDS sensing of highest capacitive loading amongst multiple sensor inputs, as performed according to an embodiment of the present disclosure.
Figure 2B:
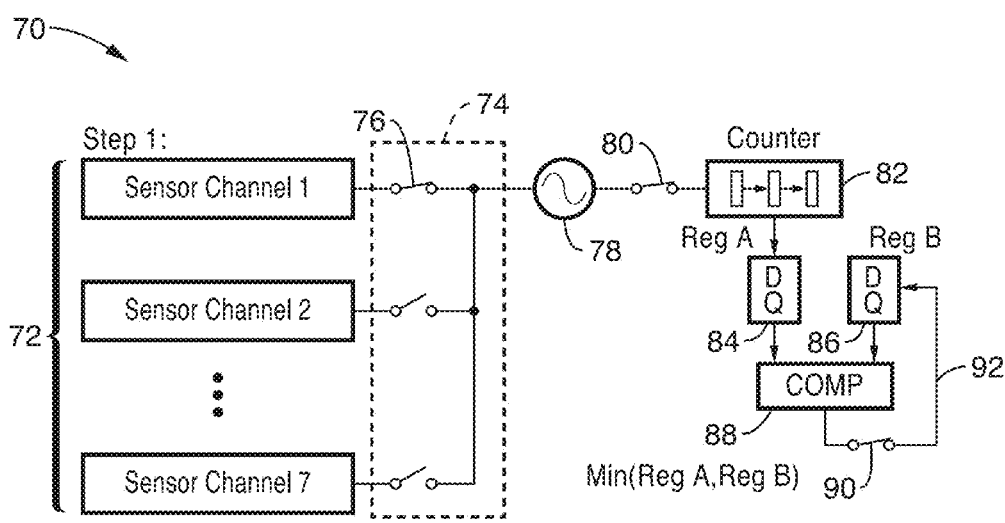
Figure 2C:
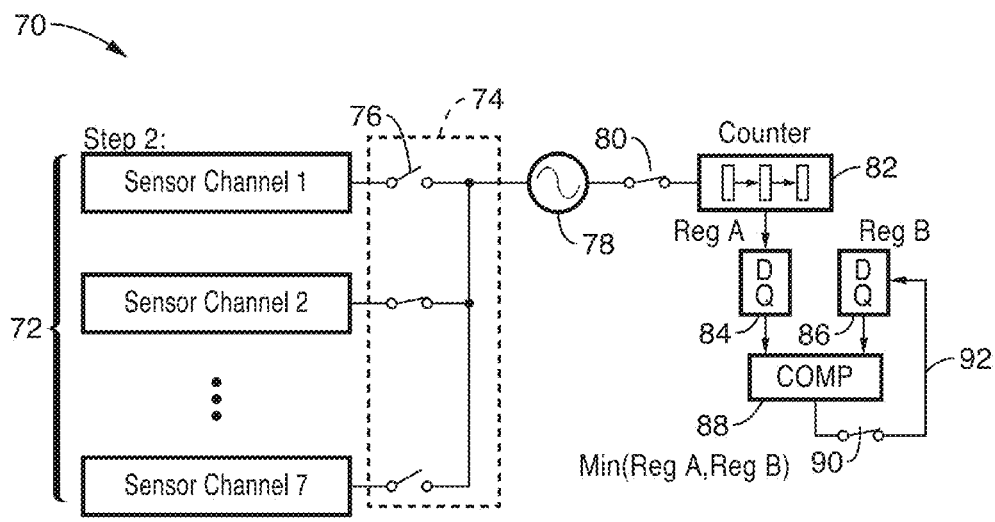
Figure 2D:
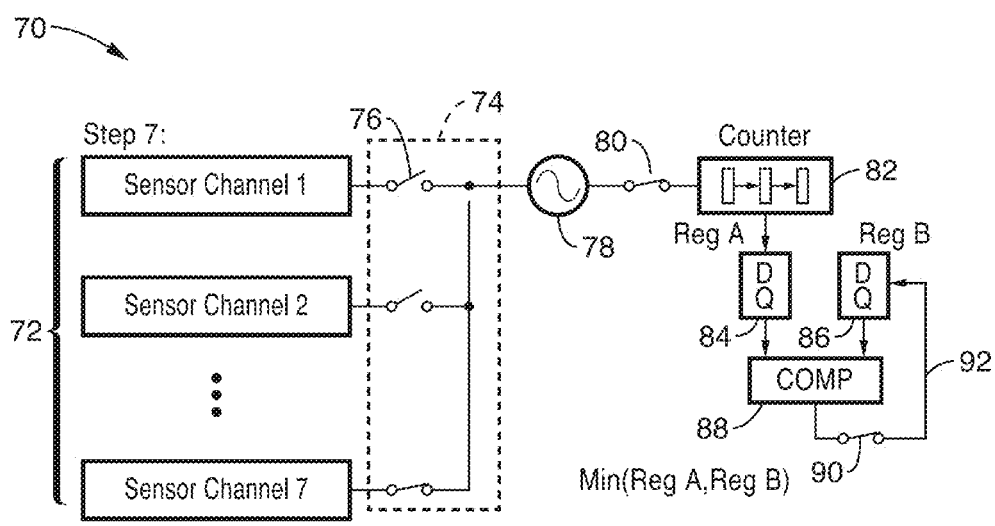

In FIG. 2A through FIG. 2D an embodiment 70 is illustrated in which each of multiple sensor channels 72 can be coupled through multiple switches 74 to the oscillator 78, each switch 76 allowing individual selection of a single sensor channel to the oscillator. In FIG. 2A (step 0) oscillator 78 is shown merely indicating an arbitrary initial condition, before connecting any sensor channel. Each following circuit FIG. 2B through FIG. 2D illustrate use of switch 80 for coupling oscillator 78 to a multiple bit counter 82 (e.g., 16 bit), for counting oscillator periods for one of the sensor channels. It should be appreciated that the number of digits (binary bits) utilized in the counter, registers and comparator, can be determined by the desired measurement accuracy. Multiple bit output from the counter is directed to a first register (RegA) 84 whose output is received, along with that of a second register (RegB) 86, by a digital comparison circuit 88, configured for outputting the minimum value between register A 84, and register B 86. It will be noted that the minimum count value is associated with the maximum load of a channel, whose load slows down oscillator 78, thus reducing the count achieved by the counter. Output from comparison circuit 88 is coupled through a switch 90 to data inputs of the second register (RegB) 86, allowing that register to be loaded, via path 92, on the basis of the comparison, as the current maximum 90 is loaded into RegB.

In FIG. 2B (step 1) sensor channel 1 is seen coupled through switch 76 to oscillator 78 which is in turn connected through switch 80 to the counting circuit 82, while FIG. 2C illustrates connection to sensor channel 2, and so on through the other sensor channels down through sensor channel 7 in step 7 as seen in FIG. 2D. Once all these steps have been performed, the value contained in RegB corresponds to the frequency counts for the maximum load on the oscillator from one of the sensor channels as the frequency of the unloaded oscillator is counted over the time window.

During each integration window, a digital counter records the number of periods that the oscillator exhibits for both input channel and reference channel (a correlated double sampling process), allowing the flicker noise and other environmental drift effects on the oscillator to be removed by subtracting between the two values. The subtracted value reflects the capacitance difference between the input channel compared to the reference channel, which is due to the additional finger-induced capacitance whose positions (movement) are being sensed. During operation, each channel of the input array is scanned sequentially.

Figure 3A:
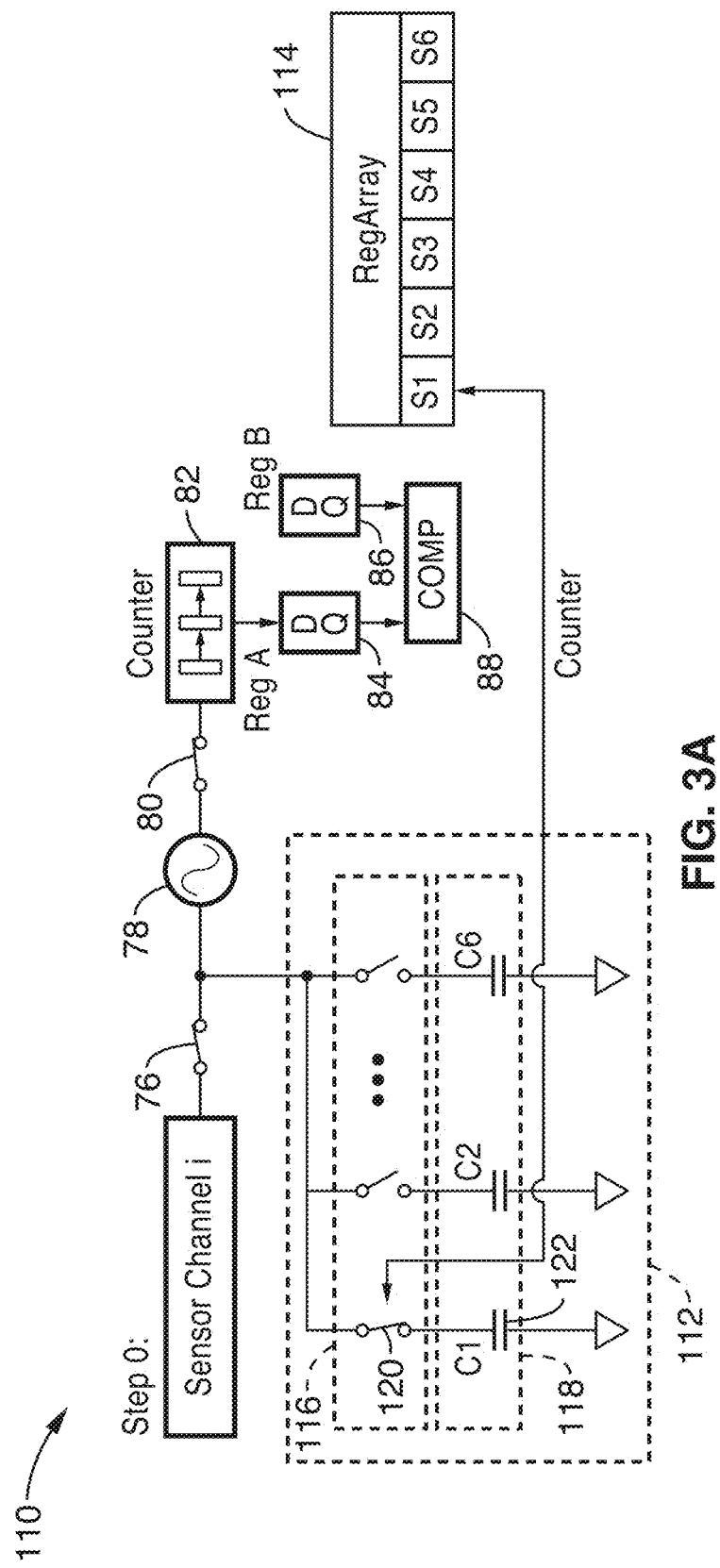
FIG. 3A through FIG. 3D are block diagrams of BCDS calibrating loads amongst multiple sensor inputs, as performed according to an embodiment of the present disclosure.

In FIG. 3A through FIG. 3D, the process 110 of calibrating each sensor channel load to the maximum load is shown. In FIG. 3A (step 0) sensor channel 1 is seen coupled through switch 76 to oscillator 78, outputting through switch 80 to counter 82. Counter 82 outputs multiple bits to a first register 84, which along with outputs from a second register 86 are input to comparator 88. In this phase, the maximum load is already known from that seen in FIG. 2A, whereby in this phase the load values are stored for each channel as the difference between the actual load for the channel subtracted from the maximum load value, these stored calibration values, allow for adjusting the sensor loads during measurement for each channel.

A parallel load is also applied to the oscillator input by a switched capacitor array 112, having multiple capacitors 118 switched by multiple switches 116. Selection of capacitors for this load is controlled by a register array 114, the output from the first register in that array (S1) is seen controlling the state of the multiple switches 116 in that array, with each switch 120 capable of being switched on or off to add or remove (connect or disconnect) individual capacitors 122 of multiple capacitors 118. The sensor channel load is thus calibrated for each channel to match the maximum load for any of the channels.

Figure 3B:
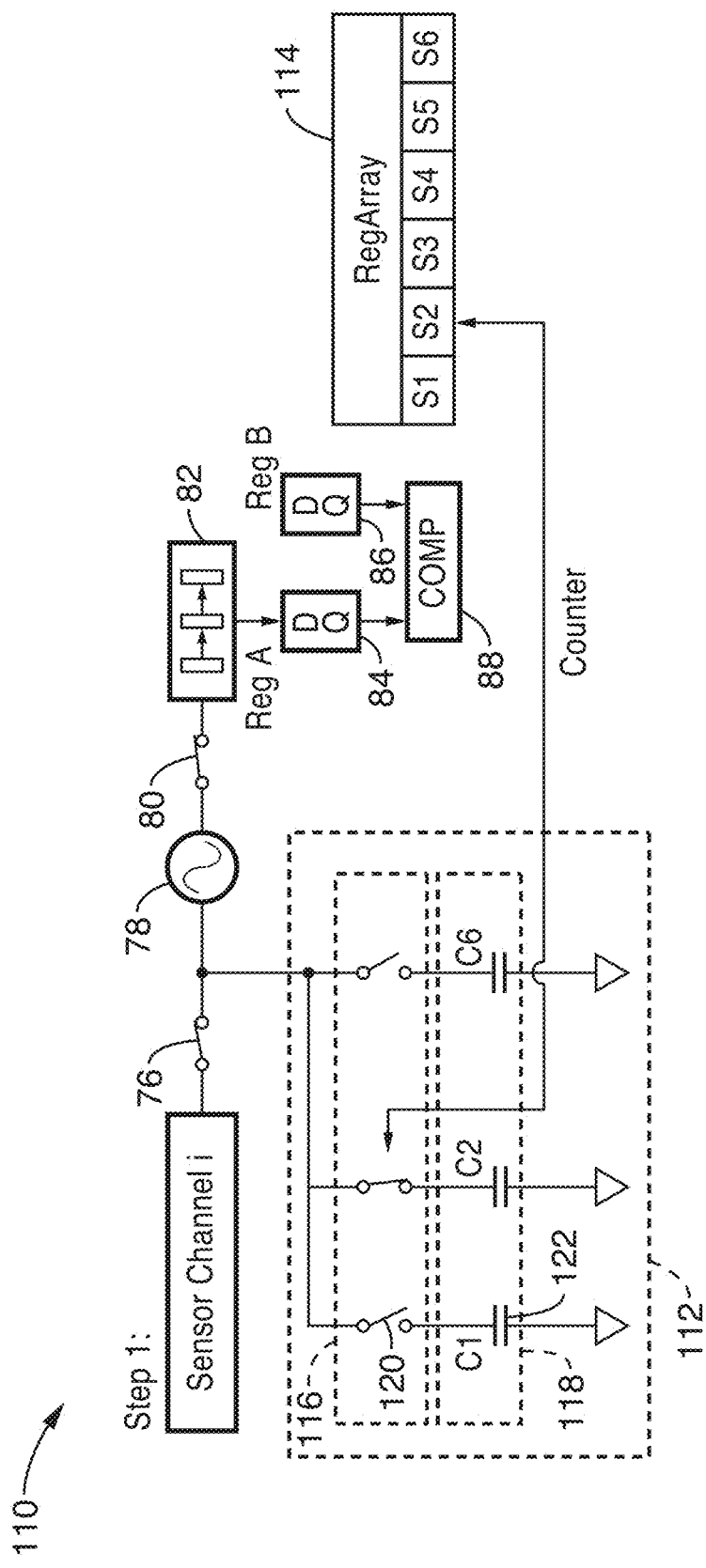
Figure 3C:
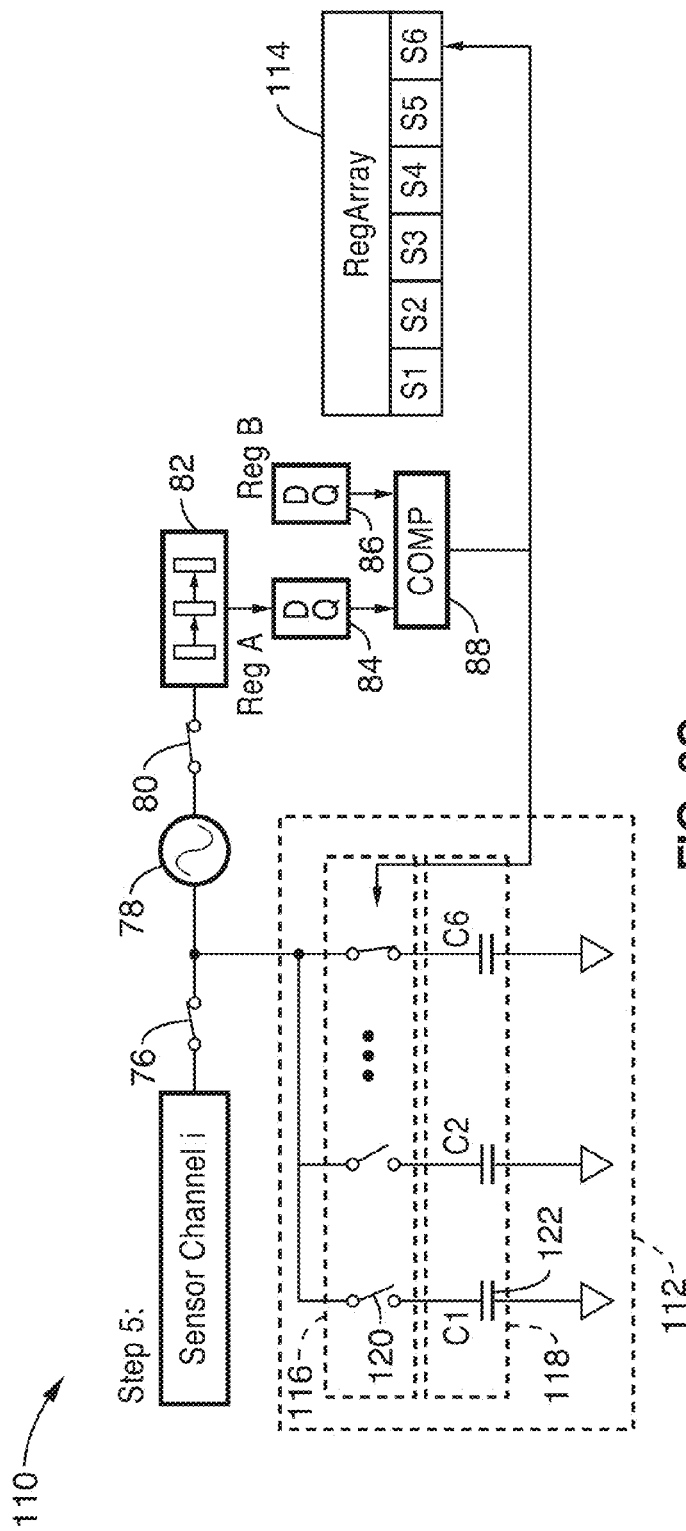
Figure 3D:
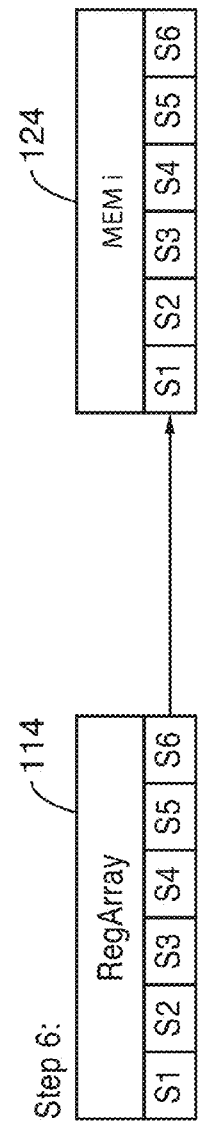

In FIG. 3B (step 1) the process is seen for sensor channel 1, and on through to the last sensor (step 5) seen in FIG. 3C, followed by storing the register values from register 114 into a calibration memory 124 in FIG. 3D (step 6). It should be appreciated that the capacitors are preferably configured with binary weighting (e.g., $C1=2C2=4C3=8C4\ldots=32C6$), with the whole calibration sequence configured to trim each sensor channel to the same load capacitance.

Figure 4:
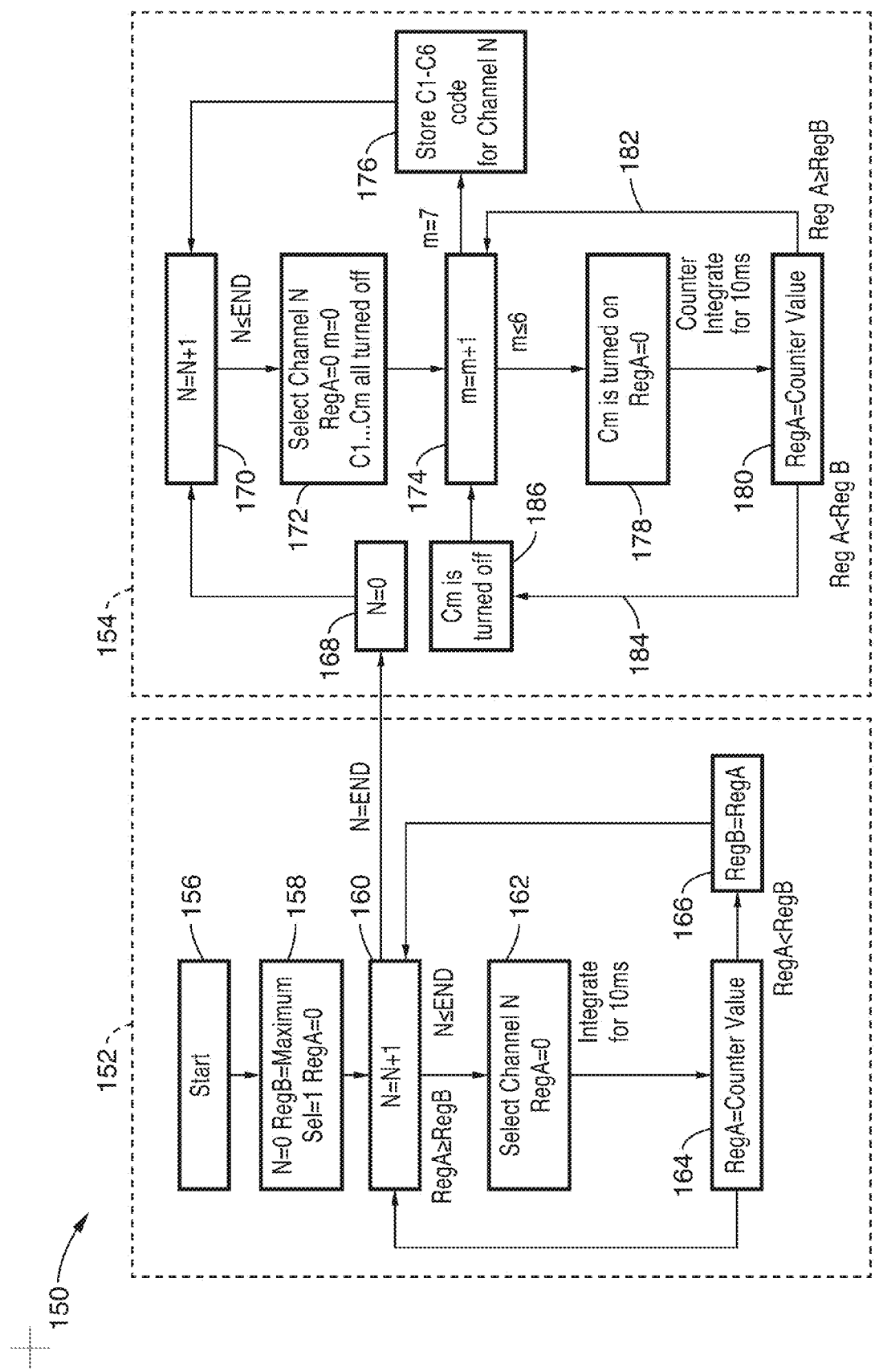
FIG. 4 is a flow diagram of BCDS sensing of highest capacitive loading and load calibration across multiple sensors, according to an embodiment of the present disclosure.

In FIG. 4, the steps of this embodiment 150 are shown for a first phase sequence in finding the channel with the highest load 152, and for a second phase sequence 154 in calibrating the load of all other channels to this maximum load. The first sequence starts 156 and is initialized 158, such as initializing a step selector (N=0), loading the second register (RegB) to its maximum (assuring an update), setting the selector and the first register to an initialization value. Then the loop commences for finding the channel with highest load, with the channel count incremented 160, channel N is selected 162 and the first register is loaded 164 with the counter value. If the value of the first register (RegA) is less than the count value in the second register (RegB), then the second register is loaded 166 with the value of the first register, since the loading of channel N exceeds that of the previously highest loaded channel (or initialization value) as stored in the second register. In either case, execution returns to the top of the loop 160 until the loading of all channels has been checked, as indicated when the value of N is at its end value, at which time the second phase 154 can be performed for calibrating the other channels.

Execution in second phase 154 commences with initializing 168 for this phase, including initializing the channel selector (N=0), before entering the channel calibration loop, which commences with incrementing 170 the channel selector. Initializing is performed 172 for an inner capacitor selection loop, which includes turning off all the capacitors (more precisely opening all capacitor-connection switches). Capacitor selection value m is incremented 174, then a capacitor(s) is activated 178 with first register zeroed out, and the counter integrates for a period of time (e.g., 10 ms) with this load, after which this first register (RegA) is loaded 180 with the counter value. If RegA is found with a value less than RegB, indicating the capacitors are set to a load that exceeds the highest channel found in phase 1, then execution 184 proceeds to turn off the capacitor (Cm) 186 and to increment 174 capacitor counter to m=m+1. Otherwise, if RegA is greater than or equal to RegB, then execution returns 182 directly to step 174 to increment capacitor count, leaving Cm active. This inner loop is executed for m less than or equal to six, as there are six capacitors in this example. In step 174, after all capacitor combinations are tried (e.g., m reaching 7 in one embodiment) then the capacitor selector values are stored 176 for channel N.

In combination with the calibration sequence for matching sensor channel loads, the BCDS system also interoperably utilizes a bootstrapping technique that reduces inter-channel coupling (typically on the order of approximately 10 to 30 pF for a 4 inch mobile device screen) by a factor of at least 100X, which is essential for increasing Z axis range to beyond 10 cm and boosting X Y axis resolution at large Z-offsets.

It should be appreciated that the steps shown in FIG. 4, and generally described elsewhere throughout the application, can be implemented using discrete logic, programming logic, gate arrays, application specific integrated circuits (ASICs), system on chip (SoC), computer processor with instructions stored in a memory for execution on the processor, other known circuit technologies or a combination of these elements without departing from the teachings of the present disclosure. In the case of processor and memory, the presented technology is non-limiting with regard to memory and computer-readable media, insofar as these are non-transitory, and thus not constituting a transitory electronic signal.

Figure 5:
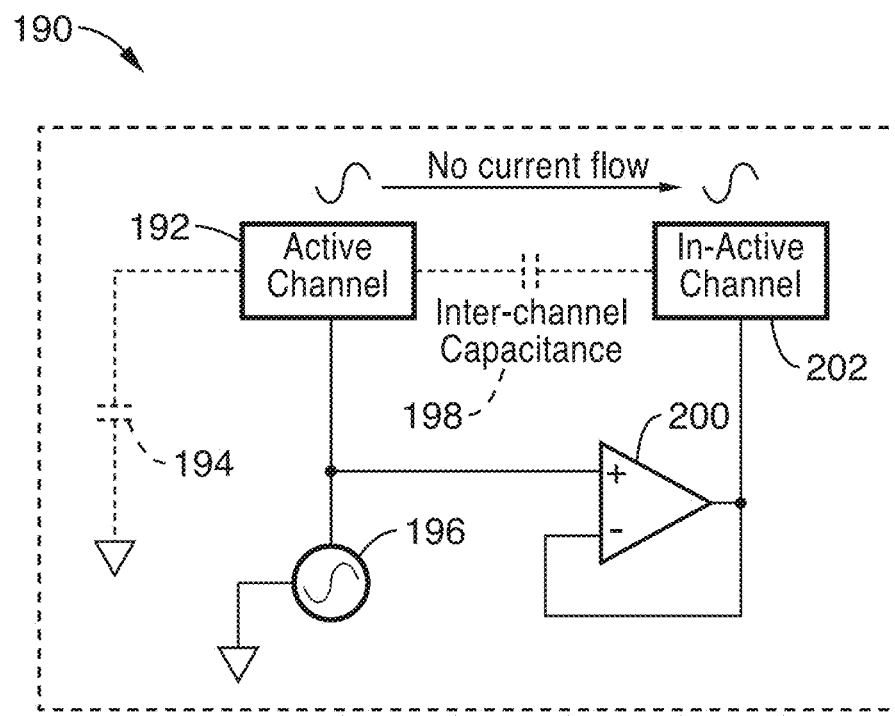
FIG. 5 is a block diagram of a bootstrap circuit of the BCDS apparatus according to an embodiment of the present disclosure.
Figure 6:
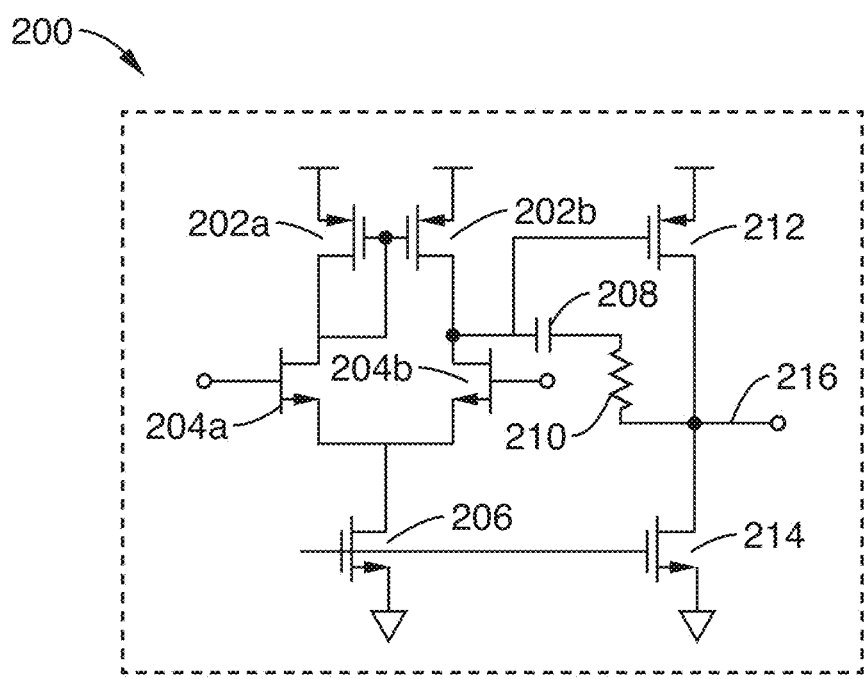
FIG. 6 is a schematic of a unity gain amplifier utilized in an example embodiment of the BCDS bootstrap circuit shown in FIG. 5, according to an embodiment of the present disclosure.
Figure 7:
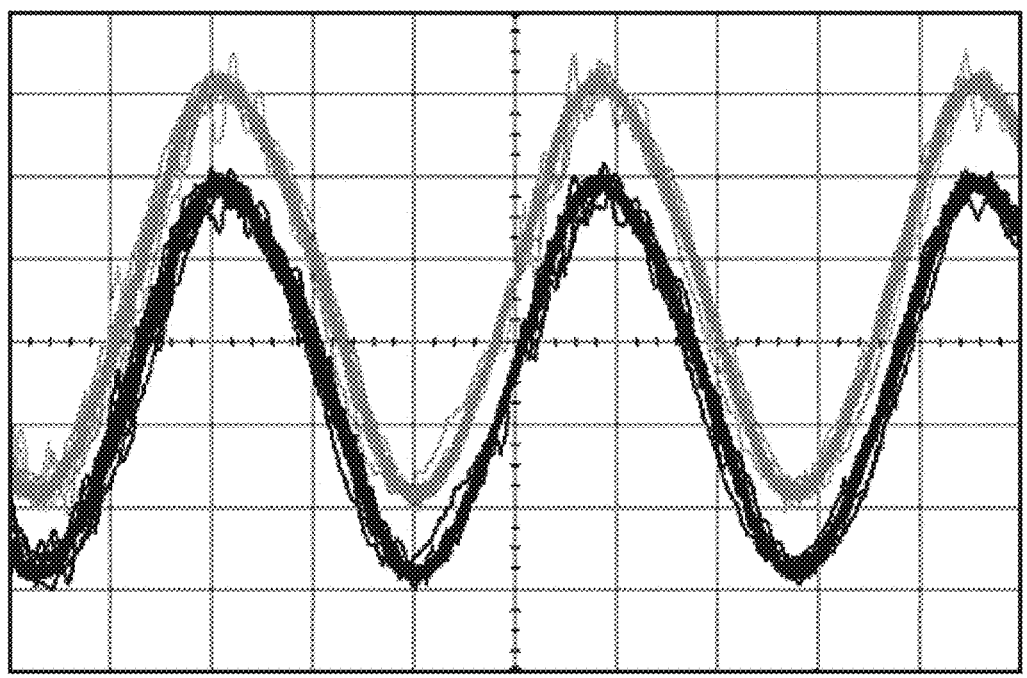
FIG. 7 is a plot of measured bootstrap and active channel waveforms in a BCDS apparatus according to an embodiment of the present disclosure.

FIG. 5 through FIG. 7 illustrate elements of a bootstrap circuit embodiment 190 for eliminating the capacitance between input electrode channels of the touch screen. In FIG. 5 an example embodiment 190 of a boot circuit is shown with active channel 192, with its capacitive load 194, coupled to oscillator 196 and buffered by an amplifier 200. Also seen in the figure is the inter-channel capacitance 198 (between input channels) which arises between the active channel and inactive channels 202. As the electrode array is scanned, a unity-gain amplifier 200 is used to sense the time-domain voltage of the active channel and replicate it on the remaining idle channels to nullify the coupling capacitance by enforcing equal potential across the inter-channel coupling capacitors.

In FIG. 6 an example embodiment for a unity gain amplifier circuit 200 is shown with two current paths through transistors 202a, 202b, in totem-pole configuration with transistors 204a, 204b gated by differential inputs, with the combined current passing through transistor 206. Output from the first stage is seen coupled to transistors 212 in a stacked transistor pair 212 and 214, with output 216 from which feedback is seen with series capacitor 208 and resistor 210. It should be appreciated, however, that this amplifier may be implemented in numerous ways without departing from the teachings of the present disclosure.

In FIG. 7, waveforms are shown for the active and bootstrap signals, with the upper waveform (shaded lighter) depicting the bootstrap channel, while the lower waveform (shaded darker) depicts the active channel. Each waveform is shown with 100 mV/division on the vertical scale and 100 ns/division on the horizontal scale.

Figure 8:
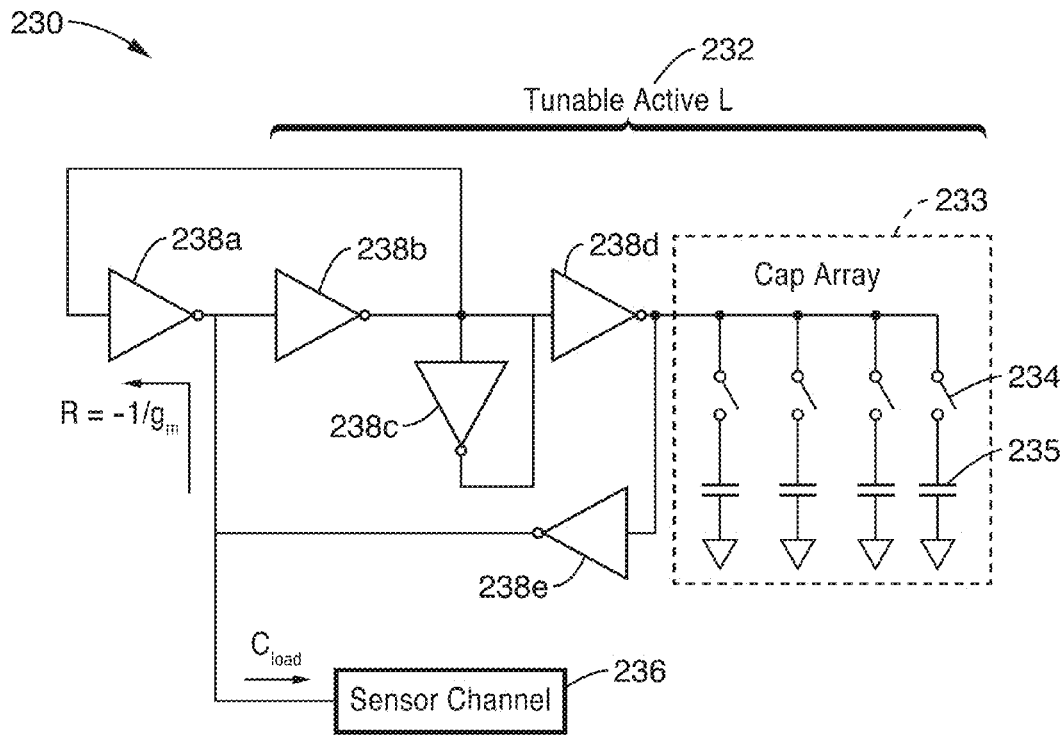
FIG. 8 is a block diagram of an oscillator circuit utilized in the BCDS apparatus according to an embodiment of the present disclosure.
Figure 9:
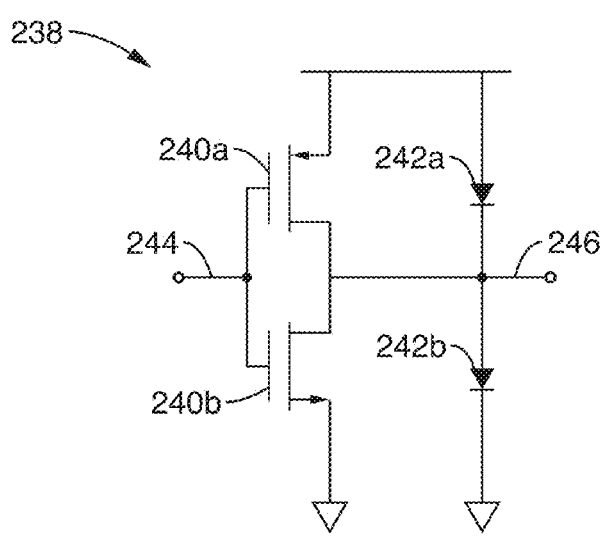
FIG. 9 is a schematic of an inverter utilized in the oscillator seen in FIG. 8 according to an embodiment of the present disclosure.
Figure 10:
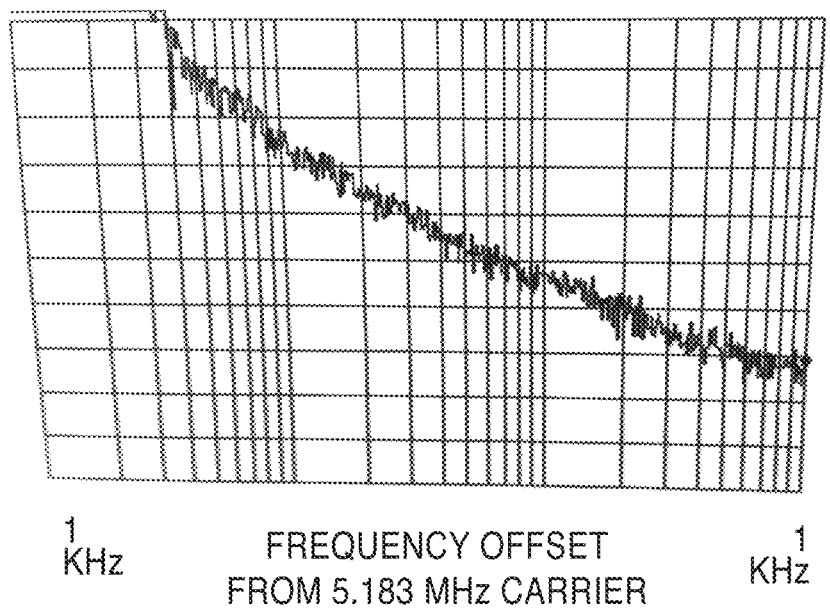
FIG. 10 is a plot of measured phase noise measurement for a BCDS apparatus according to an embodiment of the present disclosure.

FIG. 8 through FIG. 10 illustrate an example embodiment 230 of the oscillator circuit. Special considerations are given to the design of the oscillator in the present disclosure. The nature of high resolution self-capacitance sensing prefers a single-ended capacitance-modulation action with low phase noise as opposed to a differential implementation. The limited bandwidth of the bootstrapping amplifier requires a sinusoidal waveform to avoid performance deterioration of waveform replication at higher harmonics. In order to avoid a large on-chip or off-chip passive element as required in previous non-contact sensors (e.g., off-chip inductor), the BCDS sensor employs an active resonator with gain stage supplied by simple inverters. A total of five inverters are used, with one inverter (238a) creating a negative resistance $(R-1/g_m)$ and four (238b, 238c, 238d, 238e) constituting the equivalent inductor 232. A sensor channel 236, having a capacitive load $C_{load}$, is shown coupled to the output of the negative resistance inverter 238a.

The oscillator includes a digitally controlled capacitor array 233 to alter the active inductor value so that the free-running frequency can be varied, for instance from 2 MHz to 10 MHz for the exemplified embodiment, making it compatible with a wide range of scan rates and screen formats (varying integration time and channel counts). Capacitor array 233 is shown having switches 234 for switching capacitors 235 as coupled to the tunable active inductor of the oscillator.

In FIG. 9, an example inverter 238 is shown with its complementary MOS transistors 240a and 240b. To further ease amplifier design for power reduction, diode clamps 242a, 242b are paired with each inverter to reduce the swing of oscillation. Inverter input is seen 244 received at the transistor gates with inverted output 246 connected between the transistor stages and clamping diodes.

In FIG. 10, phase noise measurements are depicted for the oscillator circuit of FIG. 8.

For demonstrating mobile touch screen operation, a prototype of this BCDS was fabricated as a system on chip (SoC) having seven channels and configured to connect with a 3.4" mobile touch screen array, exemplified with the number of channels being 16 in the X direction, and 10 channels in the Y direction. The finger of the user is hovered in height and position as the counter readout is monitored. First, to evaluate the double sampling operation, counts were measured of both the reference and active channel independently, with their values plotted with standard deviation computed. Second, a subtraction operation was performed to produce a correlated double sampling (CDS) output.

Figure 11:
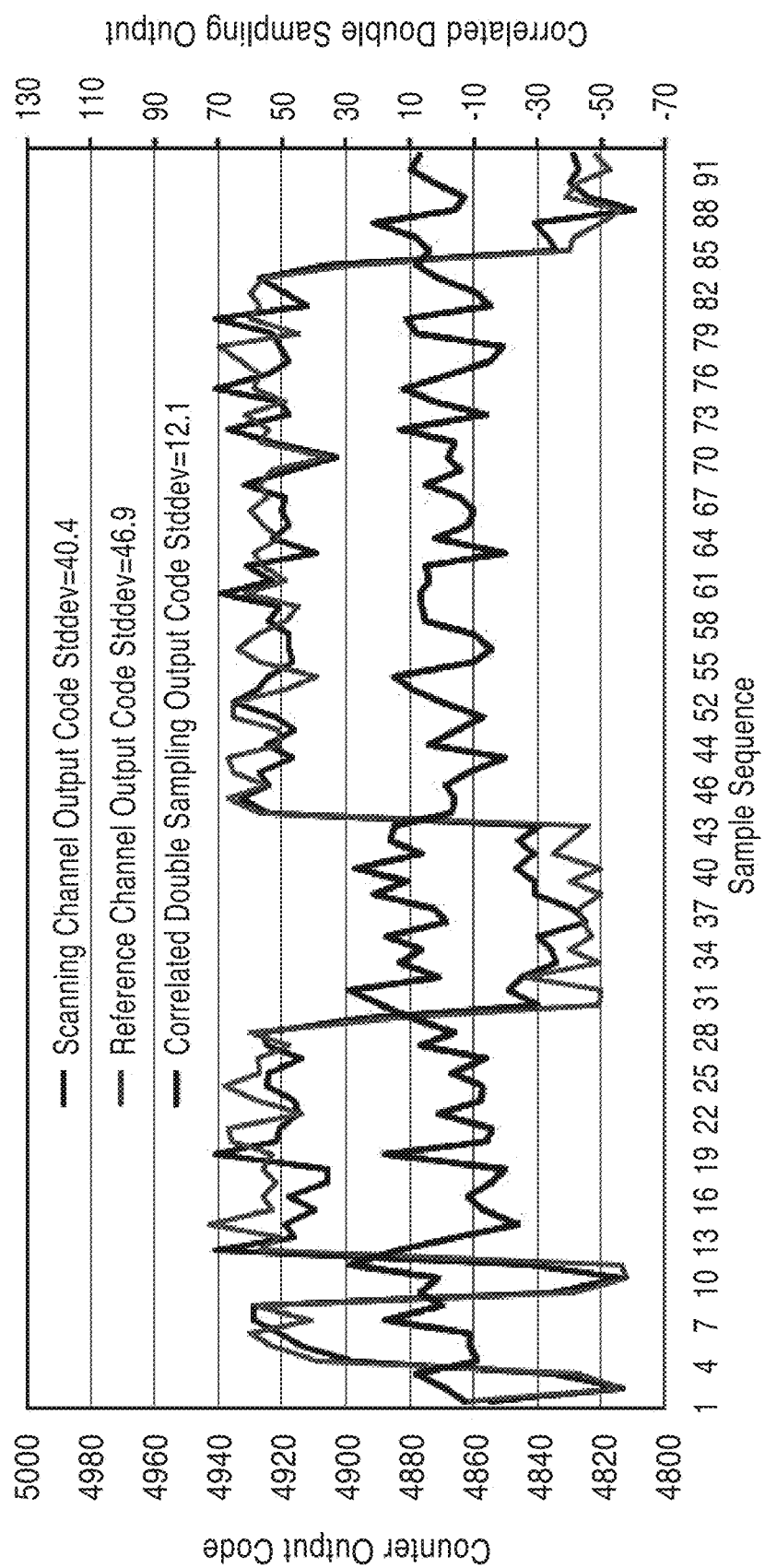
FIG. 11 is a plot of output codes in a sample sequence compared with a double sampling output according to an embodiment of the present disclosure.

FIG. 11 depicts that utilizing CDS has reduced the output standard deviation by 10.5 dB. The top two plots depict scanning channel (Stddev=40.4) and reference channel (Stddev=46.9) output codes, while the lower plot depicts the correlated double sampling output code.

Figure 12:
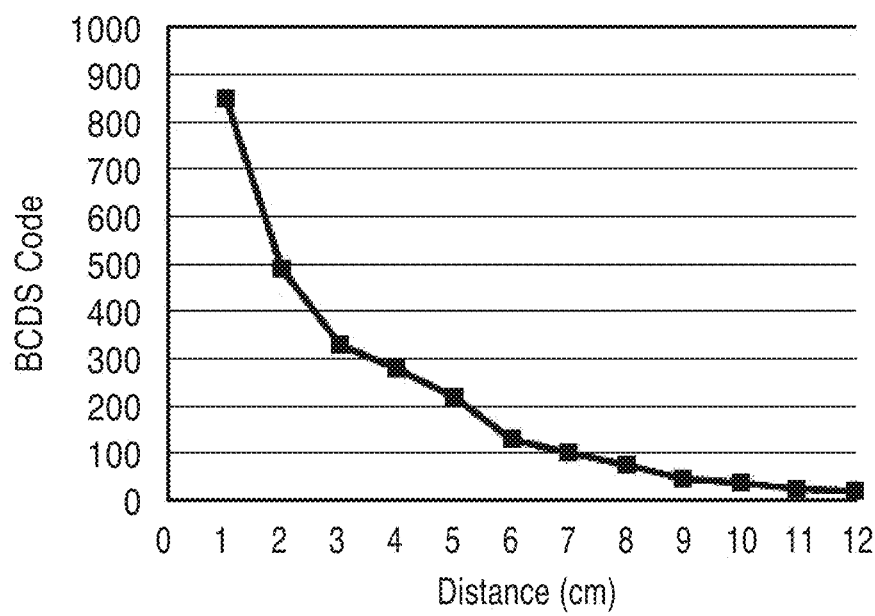
FIG. 12 is a plot of finger distance in relation to BCDS output according to an embodiment of the present disclosure.

FIG. 12 depicts plots of finger Z distance versus BCDS output as the height of the finger is varied above the touch screen. Based on output code differences among various finger heights, a final Z direction resolution of 10 mm is computed and the finger can be detected up to a maximum range of 11 cm.

Figure 13:
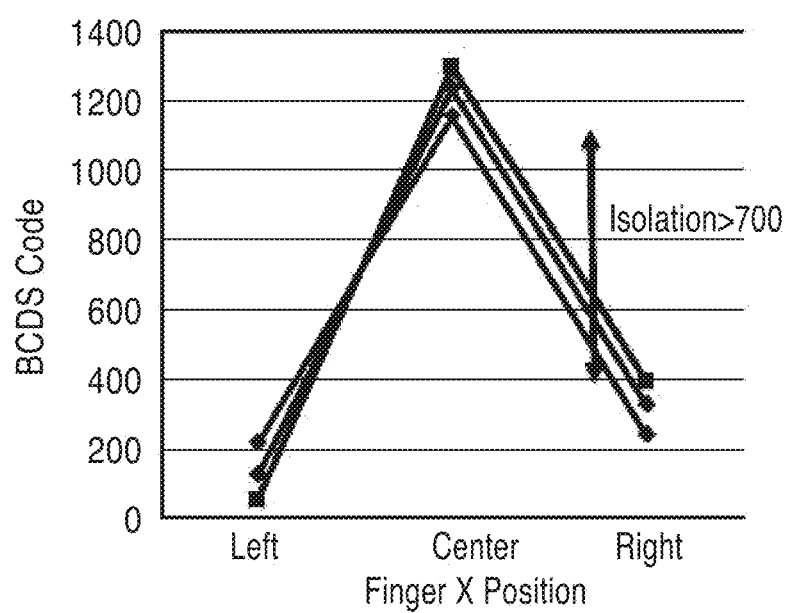
FIG. 13 is a plot of bootstrap circuitry performance according to an embodiment of the present disclosure.

FIG. 13 is a plot in which the active channel is fixed to one vertical channel (Y channel) located in the center of the HTC screen, while a finger is positioned from left to right on the touch screen (across this channel electrode), for evaluating bootstrap circuitry performance. The large code difference between positioning the finger over an active channel and over an idle channel demonstrates the strong isolation, over 700 in this example, between these two channels.

Figure 14:
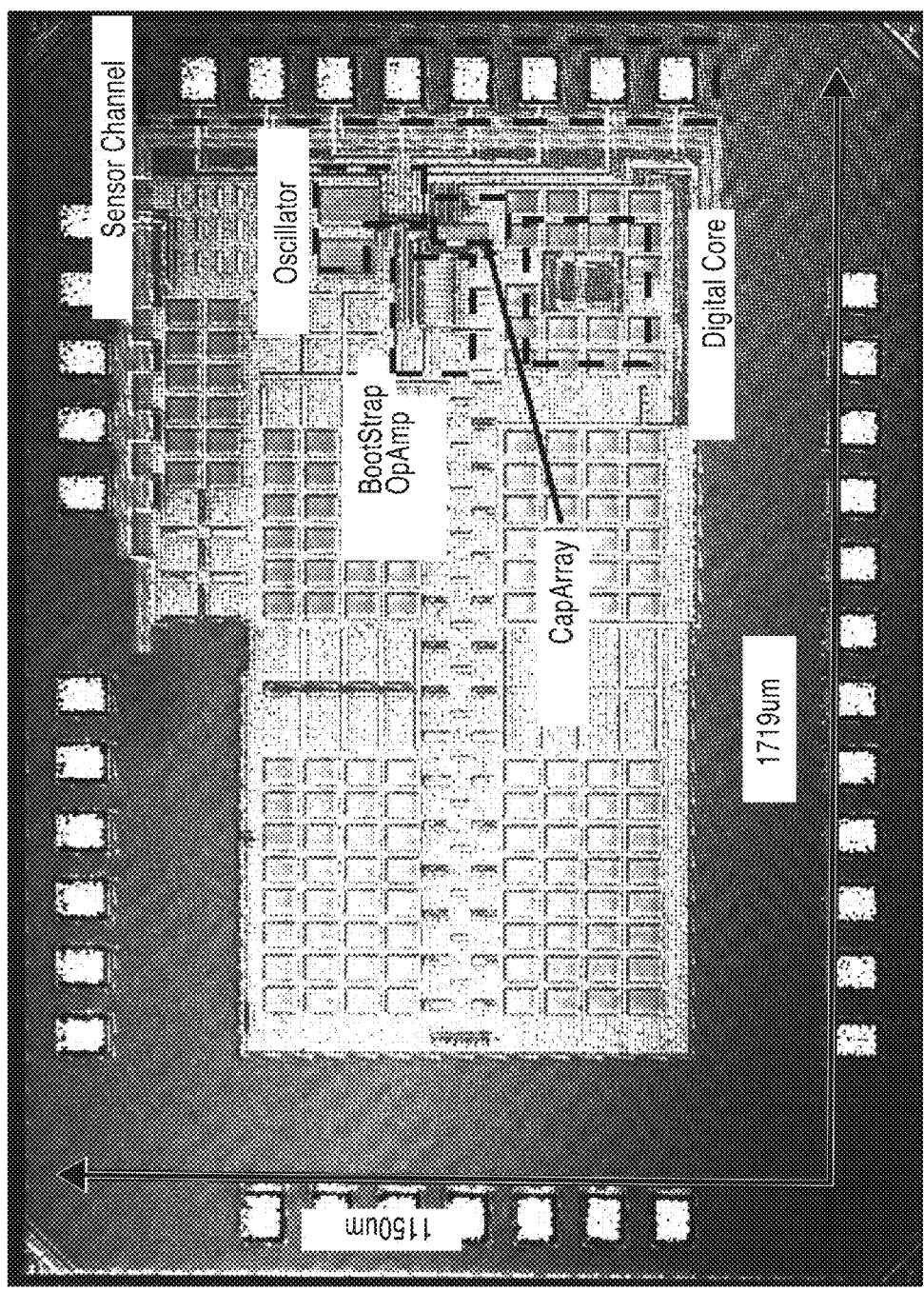
FIG. 14 is an image of a BCDS SoC fabricated according to an embodiment of the present disclosure.

FIG. 14 illustrates a BCDS SoC fabricated in a standard 65 nm CMOS process, showing width as 1719 μm and height as 1150 μm which equates to a die area of approximately 2 mm². The device is seen with bond out pads about the periphery with sections tagged as sensor channels, oscillator, bootstrap amplifier, capacitor array, and digital core. The device consumes only 2.3 mW of power, thus it appears the present disclosure is highly compatible with mobile devices.

Table 1 compares the performance of the BCDS touch sensors with several other state-of-the-art touch sensors, whose references are listed below.

Reference 5: K-D. Kim et al., "A capacitive touch controller robust to display noise for ultrathin touch screen displays", IEEE International Solid-State Circuits Conference 2012, pp. 116-117, February 2012

Reference 2: Y Z. Hu; L C. Huang; W R. Louis; J S. Robinson; S. Wagner, James C. Sturm, N. Verma, "3D Gesture-Sensing System for Interactive Displays Based on Extended-Range Capacitive Sensing", IEEE International Solid-State Circuits Conference 2014, pp. 212-213, February 2014.

Reference 3: Microchip. http://www.microchip.com/wwwproducts/Devices.aspx?product=MGC3130

The BCDS extends the traditional 2D touch sensing approach, such as seen in reference 5, to enable new 3D applications, while allowing the cost of power and area to be reasonable for mobile devices by using an active resonator to reduce size and by limiting the oscillator output swing to confine DC power. BCDS also provides comparable Z range and resolution to other 3D contactless touch sensors reported previously for large displays where there is far less interchannel capacitance due to the large electrode spacing and substantially large electrode area for exhibiting increased finger capacitance. To show that the BCDS sensor is more suitable for small mobile screens, the sensing height is normalized in row 6 of the table based on the overall touch panel size. The realized BCDS prototype sensor provides a factor of 3 to 17X improvement in normalized sensing height over that of prior arts.

B. Oscillator Detector with Oscillator, Divider and Dicke Switch

This section describes an embodiment utilizing a single oscillator that runs continuously, with each oscillation period being counted with a frequency counter. An antenna (sensor channel) is connected to the oscillator so that if the finger of the user is moved relative to the antenna the impedance of the antenna will change along with the frequency of the oscillator.

Although this approach is theoretically workable, the oscillator is free-running and the center frequency is subject to drift, thereby creating a poor estimation of finger position. To solve this problem, the following embodiment utilizes a switch between the antenna and the oscillator. It should be noted that in the industry any switch connected between an antenna and a circuit is referred to as a "Dicke" switch.

Figure 15:
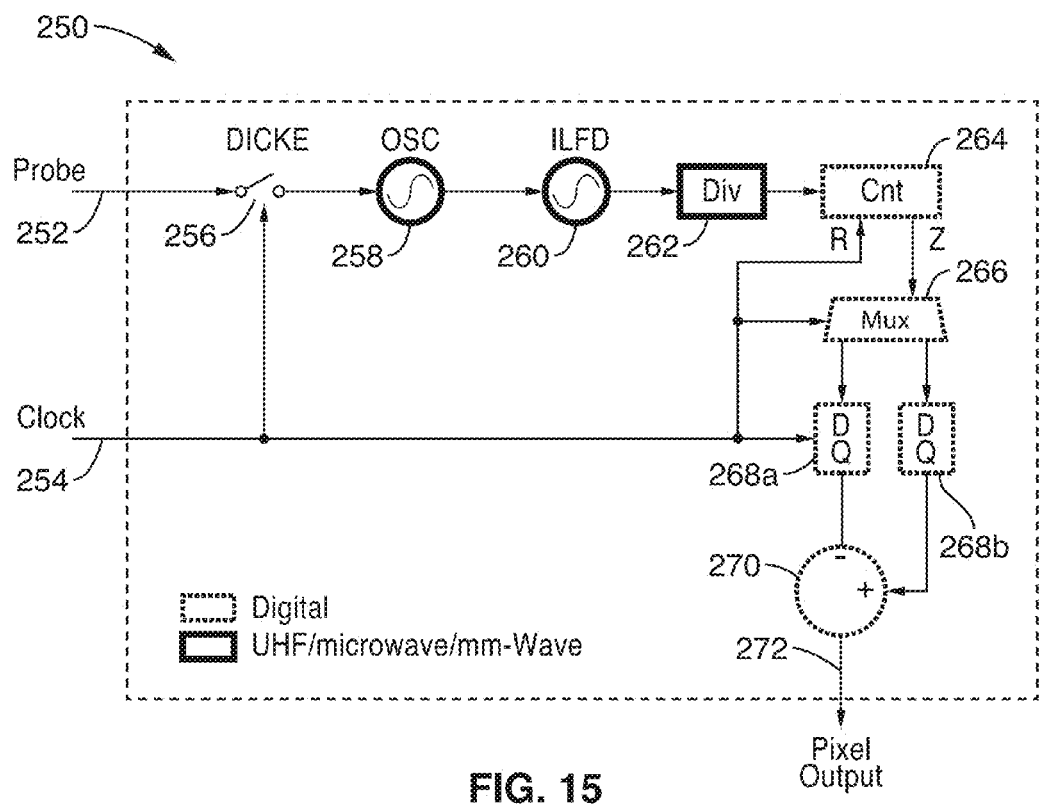
FIG. 15 is a block diagram of a touch sensing digital oscillator detector using a Dicke switch according to an embodiment of the present disclosure.

FIG. 15 illustrates an example embodiment 250 of a touch sensing digital oscillator detector showing the oscillator, divider and Dicke switch. A probe 252 and clock 254 are seen coupled to the circuit. Probe line 252 is coupled through Dicke switch 256 whose on/off states are controlled by clock 254. Probe is coupled as a load upon oscillator 258, whose output is received by an injection locked frequency divider (ILFD) 260, and then another divider 262, such as a 2ⁿ divider. It should be noted that the oscillator 258, ILFD 260 and divider 262 are UHF or microwave or mm-wave elements, while the elements downstream of the divider are digital elements.

Output from divider 262 is received at a counter 264 having a reset (R), with an output (Z) coupled through a demultiplexer 266 (e.g., such as having a width of 12 binary bits). The clock signal 254 is received as a selector by the demultiplexer to select which output is active, whether output to a data register 268a, or a data register 268b. A comparison circuit 270 receives output from both 268a, 268b and outputs 272 a difference value.

In operation, the Dicke switch is disconnected and the number of periods (n1) are count for a given observation time (e.g., 2 ms). Then the switch is connected again to count the number of oscillator periods (n2). By subtracting these two results with digital circuits, the true oscillator deviation can be determined.

Figure 16:
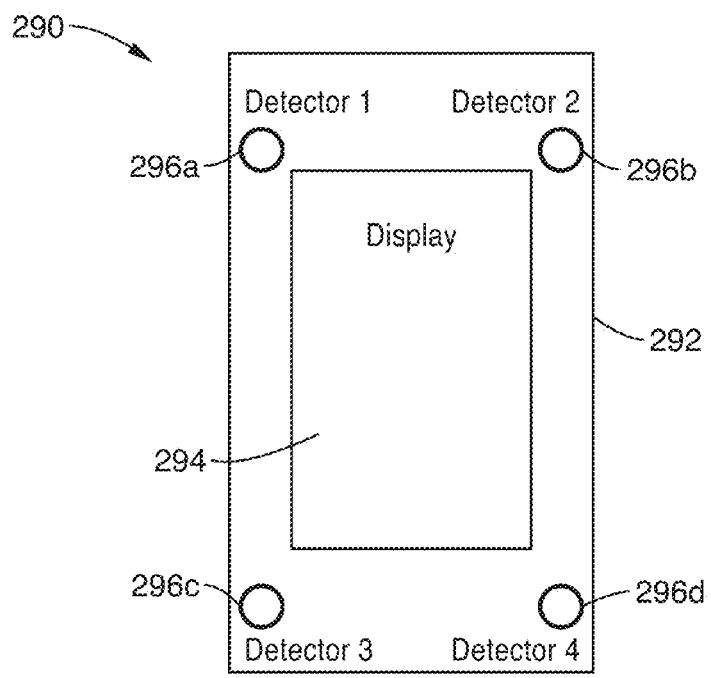
FIG. 16 is a top view of an example touch sensing device shown with a display screen exemplifying hardware according to an embodiment of the present disclosure.

FIG. 16 illustrates an embodiment 290 of a touch sensing device, having a housing 292, and display 294, about which are placed multiple detectors. In the example shown, one each of detectors 296a, 296b, 296c, 296d are placed at each of the four corners of the touch screen display of a portable electronic device for position detection. Using this configuration, the counts of the four detectors can be compared to estimate the location of a finger over the display surface. Although sensor inputs are shown for the sake of simplicity being separate from the display, it should be appreciated that for this embodiment and others described herein, that the sensor channels can be incorporated into the display itself, and may comprise a plurality of sensors, for instance greater than sixteen, and up to dozens of sensor channels.

Figure 17:
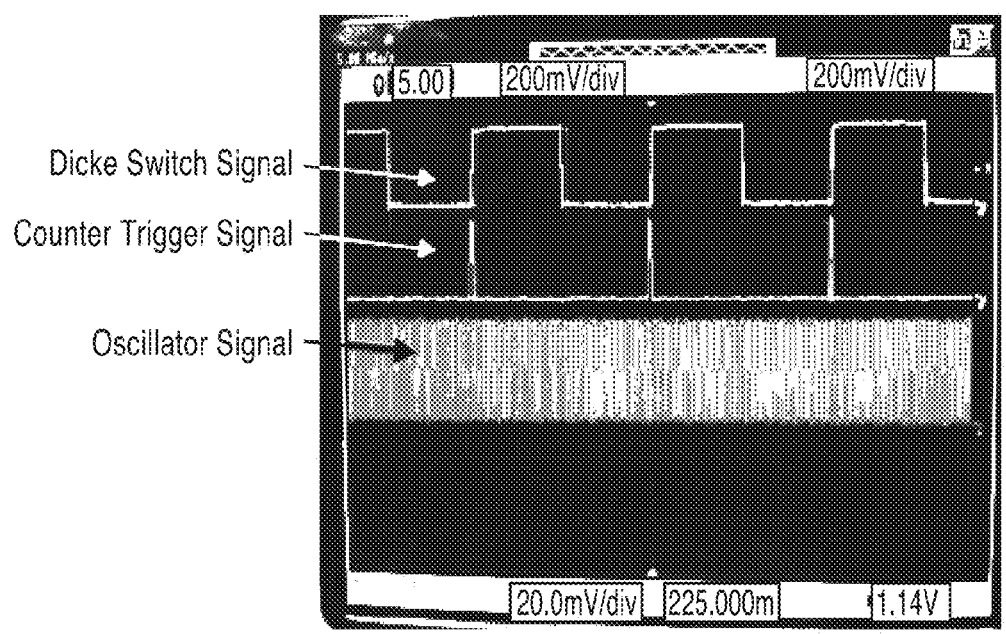
FIG. 17 is a timing diagram for signals and oscillator output for the apparatus of FIG. 15 as measured for an embodiment of the present disclosure.

FIG. 17 depicts a timing diagram for the signals seen in FIG. 15, showing the Dicke switch signal, counter trigger signal, and oscillator signal. A test circuit on a chip has been fabricated and tested. The tests indicate that a simple touch, untouch and near touch (5 mm to antenna) case can be detected by the system.

Table 2 lists parameters of non-contact position sensing for this approach to non-contact position sensing, with Table 3 illustrating the relationship between finger distance to antenna (sensor) and frequency shift.

Figure 18:
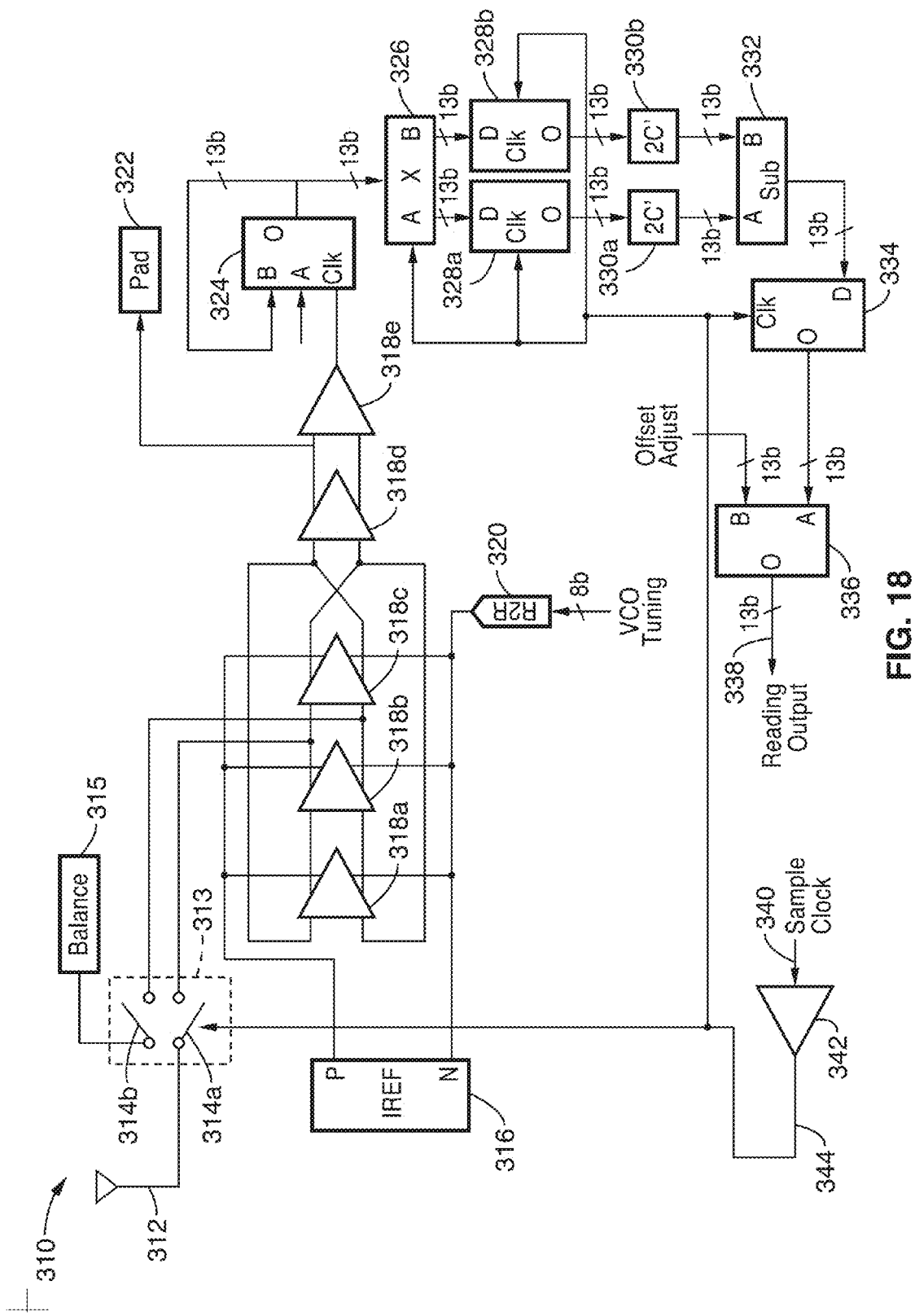
FIG. 18 is a block diagram of Dicke switch, oscillator, and oscillator detector, for non-contact sensing according to an embodiment of the present disclosure.

FIG. 18 illustrates an example embodiment 310 of the oscillator detector with oscillator, divider and Dicke switch. Antenna 312 is seen coupled through a differential Dicke switch 313 shown controlled by a sample clock 340 through a buffer 342 to Dicke switch control output signal 344. The antenna signal passes through a switch 314a, while output from a balance circuit 315 is coupled through another part of the Dicke switch 314b. An oscillator is seen comprising differential amplifiers 318a, 318b, 318c, 318d, 318e, in the midst of which receives the signal from antenna 312 and balance 315 when the Dicke switch 313 is closed (active). The oscillator is also shown receiving a differential current reference 316 having a positive and negative output. A resistor ladder (R2R) 320, which receives a digital VCO tuning control (e.g., 8 bits), is also shown coupled to one side of the power supply from IREF 316. A pad 322 is coupled to the final oscillator stage 318e, while the oscillator output is received as the clock (Clk) for a fixed counter 324, having A and B inputs and an output (O). Clock output, such as 13 binary bits, is seen received by a demultiplexer 326, outputting to data registers 328a, 328b, and then to a two's complement (2C') conversion 330a, 330b, whose outputs are subtracted 332 and stored in a register 334, and received through a second comparator 336 which receives an offset adjustment, and which outputs a reading output 338.

Figure 19:
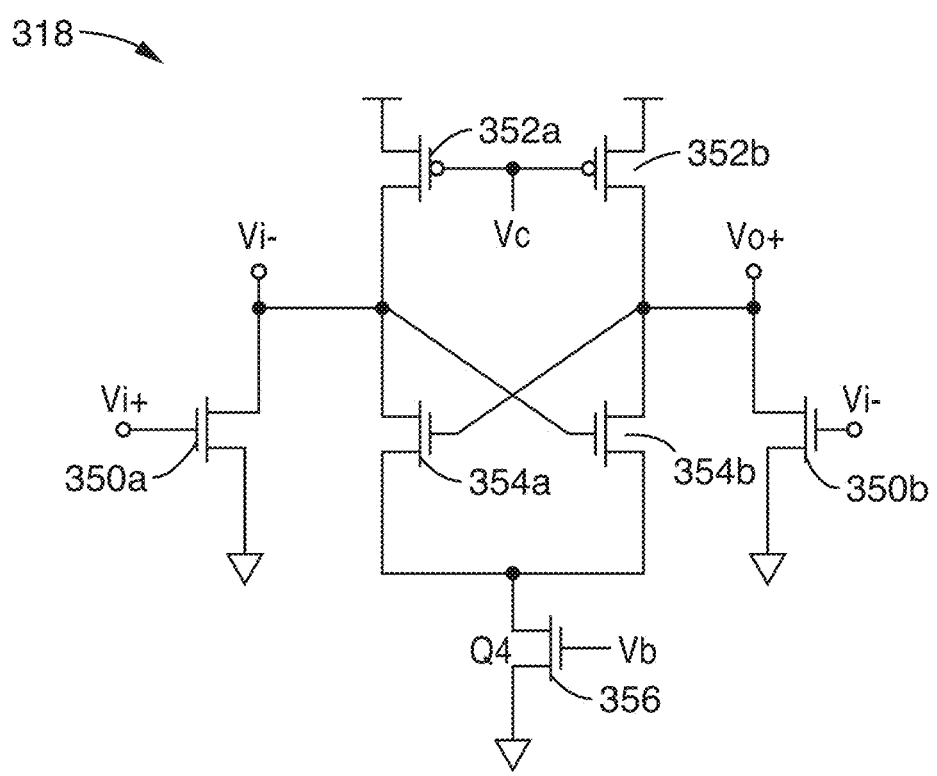
FIG. 19 is a schematic of an oscillator stage utilized according to an embodiment of the present disclosure.

FIG. 19 illustrates an example stage 318 of the oscillator showing differential input transistors 350a, 350b, each coupled to a side of two current paths ascribed by complementary transistors 352a, 354a on a first leg, and 352b, 354b on a second leg. Combined current of both legs is passed through supply transistor 356. The feedback will be noted in the cross-connection of the gates on transistors 354a, 354b, with opposing current legs.

Embodiments of the present technology may be described with reference to flowchart illustrations of methods and systems according to embodiments of the technology, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

It will further be appreciated that "programming" as used herein refers to one or more instructions that can be executed by a processor to perform a function as described herein. The programming can be embodied in software, in firmware, or in a combination of software and firmware. The programming can be stored local to the device in non-transitory media, or can be stored remotely such as on a server, or all or a portion of the programming can be stored locally and remotely. Programming stored remotely can be downloaded (pushed) to the device by user initiation, or automatically based on one or more factors. It will further be appreciated that as used herein, that the terms processor, central processing unit (CPU), and computer are used synonymously to denote a device capable of executing the programming and communication with input/output interfaces and/or peripheral devices.

From the description herein, it will be appreciated that the present disclosure encompasses multiple embodiments which include, but are not limited to, the following:

1. A non-contact position and motion sensing apparatus, comprising: (a) multiple sensor channels; (b) an oscillator circuit configured for being separately connected to each channel of said multiple sensor channels while performing non-contact sensing; (c) a counter circuit configured for counting oscillator periods over an integration time window and outputting a binary count value as an estimation of the frequency output of said oscillator; (d) a count storage and comparison circuit, coupled to said counter circuit, and configured for performing a calibration in which maximum load placed on said oscillator from a sensor channel is determined from said multiple sensor channels, and a capacitive loading is determined for each other channel to equalize loading during non-contact sensing operation; and (e) a bootstrap circuit coupled to each of said multiple sensor channels and configured for sensing time-domain voltage of an active channel in said multiple sensor channels and replicating it on remaining non-active channels during non-contact sensing to nullify capacitive coupling with the active channel in response to enforcing equal potentials across inter-channel coupling; (f) wherein during operation for non-contact sensing, selected channels are connected to said oscillator with position and motion being determined in response to frequency changes of said oscillator determined with respect to a reference capacitive load, and wherein both equalization of loading performed in response to loading calibration, and nullifying capacitive coupling between channels, increases sensor channel measurement accuracy.

2. The apparatus of any preceding embodiment, wherein said count storage and comparison circuit comprises: (a) a demultiplexer receiving the binary count value from said counter and passing this to either a first or second data storage register in response to receiving a selector signal; (b) a difference circuit configured for generating a binary output value based on the difference between data outputs from said first data storage register and said second data storage register, so that maximum load is found in a process of loading the second data storage register with a new binary count value that is lower than the value previously stored in said second data storage register, and after performing the calibration across all sensor channels the second data storage register represents maximum load on any channel; and (c) a capacitor array coupled as a load to said oscillator, said capacitor array having multiple capacitors, each of which is selected for connection to said oscillator; (d) wherein during calibration an amount of equalization capacitance is determined and stored for each sensor channel toward matching the maximum load; (e) wherein during operation in performing non-contact position and motion sensing the stored equalization capacitance is applied from the capacitor array to said oscillator.

3. The apparatus of any preceding embodiment, wherein said count storage and comparison circuit includes multiple data registers or memory, into which capacitor selection data is stored for equalizing loading for each channel.

4. The apparatus of any preceding embodiment, wherein said bootstrap circuit comprises a unity gain amplifier coupled to an input of said oscillator, and a separate switch coupling output from said unity gain amplifier to each of said sensor channels, so that oscillator input voltage from the active sensor channel is coupled through the switches to the inactive sensor channels to equalize voltage potentials between channels.

5. The apparatus of any preceding embodiment, further comprising at least one buffer coupled between said oscillator and said counter circuit.

6. The apparatus of any preceding embodiment, wherein said oscillator comprises an inverter-based active resonator, a ring oscillator, or an inductor-capacitor (LC) oscillator.

7. The apparatus of any preceding embodiment, wherein said oscillator frequency is in the range from 100 MHz to 100 GHz.

8. The apparatus of any preceding embodiment, wherein each of said multiple sensor channels is configured for coupling to a sensor proximal a display screen, or touch screen display.

9. The apparatus of any preceding embodiment, wherein said apparatus is configured for implementation with discrete electronics, integrated electronics (on-chip), or a combination of discrete and integrated electronics.

10. A bootstrapping and correlated double sampling (BCDS) non-contact sensing apparatus, comprising: (a) an oscillator circuit configured for oscillating at different frequencies depending on a load coupled to said oscillator; (b) multiple sensor channels, with each sensor channel coupled as the load to said oscillator through a sensor channel connection switch; (c) a frequency counter circuit coupled to the output of the oscillator and configured for outputting a binary count value; (d) a demultiplexer receiving the binary count value from the frequency counter which is passed to a first or second demultiplexed output in response to receiving a selector signal; (e) a first data storage register coupled to a first demultiplexed output of said demultiplexer, and a second data storage register coupled to a second demultiplexed output of said demultiplexer; (f) a difference circuit configured for generating a binary output value based on the difference between data outputs from said first data storage register and said second data storage register; (g) a capacitor array coupled as a load to said oscillator, said capacitor array having multiple capacitors, each of which is selected for connection to said oscillator through a capacitor connection switch; (h) a bootstrap circuit coupled to each of said multiple sensor channels and configured for sensing time-domain voltage of an active channel in said multiple sensor channels and replicating it on remaining idle channels to nullify capacitive coupling with the active channel in response to enforcing equal potentials across inter-channel coupling; (i) wherein calibration is performed to equalize loading of each of the sensor channels by utilizing a first and second operating phase of calibration; (j) wherein during a first operating phase of calibration it is determined which sensor channel in said at least two sensor channels presents a highest level of loading on said oscillator, in response to activating a sensor channel connection switch from a single sensor channel to the oscillator, taking a count of oscillator periods within a time window and storing in a first register, determining a count difference between said first register and a second register, and storing the count of oscillator periods in said first register into said second register if said count of oscillator periods for said single sensor channel indicates presentation of a higher load on said oscillator than indicated by the count of oscillator periods stored in said second register, then repeating the process for each single sensor channel in said multiple sensor channels; (k) wherein during a second operating phase of calibration loads are calibrated for each of said multiple sensor channels by selectively activating capacitors in said capacitor array through said capacitor connection switches until the load on that sensor channel is sufficiently matched with that of the sensor channel presenting the highest load level on the oscillator, with data being stored, in multiple data registers or memory, about which capacitors were selectively activating to obtain that level of matching; (l) wherein during operation of said apparatus for non-contact sensing, a selected channel is connected to said oscillator, and loaded by said capacitor array to a level as set by data stored for that channel during calibration phase two, with position and motion being determined in response to frequency changes of said oscillator determined with respect to a reference capacitive load in correlated double sampling to increase measurement accuracy on any sensor channel.

11. The apparatus of any preceding embodiment, wherein said bootstrap circuit comprises a unity gain amplifier coupled to an input of said oscillator, and a separate bootstrapping switch coupling output from said unity gain amplifier to each of said sensor channels, so that oscillator input voltage from the active sensor channel is coupled through the bootstrapping switches to the inactive sensor channels to equalize voltage potentials between channels.

12. The apparatus of any preceding embodiment, further comprising at least one buffer coupled between said oscillator and said counter circuit.

13. The apparatus of any preceding embodiment, wherein said oscillator comprises an inverter-based active resonator, a ring oscillator, or an inductor-capacitor (LC) oscillator.

14. The apparatus of any preceding embodiment, wherein said oscillator frequency is in the range from 100 MHz to 100 GHz.

15. The apparatus of any preceding embodiment, wherein each of said multiple sensor channels is configured for coupling to a sensor proximal a display screen, or touch screen display.

16. The apparatus of any preceding embodiment, wherein said apparatus is configured for implementation with discrete electronics, integrated electronics (on-chip), or a combination of discrete and integrated electronics.

17. A method of performing non-contact sensing of nearby position and motion, comprising: (a) performing a calibration process for multiple sensor channels coupled to an oscillator, in which maximum load on said oscillator for any of these sensor channels is determined, and a capacitive load determined for each other channel to bring it to the same maximum load when operating to perform non-contact sensing; (b) bootstrapping each of said multiple sensor channels to sense time-domain voltage on an active channel and replicate it on remaining non-active channels during non-contact sensing to nullify capacitive coupling with the active channel in response to enforcing equal potentials across inter-channel coupling; and (c) performing non-contact sensing of position and motion by measuring and correlating oscillator frequency changes on each of said multiple channels, whereas the calibration and bootstrapping steps result in increasing accuracy of the non-contact sensing.

18. The method of any preceding embodiment, wherein each of said multiple sensor channels is configured for coupling to a sensor proximal a display screen, or touch screen display.

19. The method of any preceding embodiment, wherein said method is configured for implementation with discrete electronics, integrated electronics, or a combination of discrete and integrated electronics.

20. The method of any preceding embodiment, wherein said calibration process comprises sequencing through each of the multiple sensor channels during a first phase of calibration to determine which sensor channel has presents the highest load upon the oscillator, as well as sequencing through each of the multiple sensor channels during a second phase of calibration to determine the amount of capacitance required to bring each of the other sensor channels to match this highest load.

21. A bootstrapped and correlated double sampling (BCDS) sensing apparatus, the apparatus comprising: (a) a plurality of input sensor channels; (b) a digital counter having an input and an output; (c) an inverter based active resonator circuit having an oscillator input selectively connectable to any one of said input sensor channels, the resonator circuit having an output connected to the input of the digital counter; (d) a shunt capacitor array selectively connectable to any one of said input sensor channels; and (e) a bootstrapping circuit selectively connectable to any one of said input sensor channels; (f) wherein frequency of the active resonator is monitored by the digital counter using an integration window time to estimate loading capacitance of the oscillator; (g) wherein the capacitor array is configured to calibrate unloaded capacitance of each sensing channel to a reference value; (h) wherein during each measurement cycle, the oscillator is first connected to a desired input sensor channel for a given integration time, and then connected to a reference channel with identical capacitance for the same integration window; (i) wherein during each integration window, the digital counter records the number of periods that the oscillator exhibits for both input channel and reference channel; and (j) wherein the bootstrapping circuit is configured to reduce inter-channel coupling.

22. An oscillator-based motion detector circuit, comprising: (a) an antenna input; (b) an oscillator; (c) a Dicke switch between the antenna input and the oscillator, said Dicke switch having an input for receiving clock signals to open and close the switch; and (d) a frequency counter circuit coupled to the output of the oscillator; (e) wherein said frequency counter circuit is configured for counting a first number of oscillation periods when said Dicke switch is open, for counting a second number of oscillation periods when said Dicke switch is closed, and for subtracting the first and second number of oscillation periods counted to determine a count difference; and (f) wherein said count difference is indicative of true oscillator frequency deviation resulting from movement of an object in relation to an antenna connected to the antenna input.

23. The motion detector of any preceding embodiment, further comprising circuitry for generating a pixel movement output based on said true oscillator frequency deviation for controlling a visual display.

24. An oscillator-based method of detecting motion of an object in relation to an antenna coupled to an oscillator, the method comprising: (a) providing a Dicke switch between the antenna and oscillator, said Dicke switch having an input for receiving clock signals to open and close the switch; and (b) clocking the Dicke switch to be open during a first time period during motion of an object and closed for a second time period during motion of the object; (c) counting a first number of oscillation periods when said Dicke switch is open; (d) counting a second number of oscillation periods when said Dicke switch is closed; (e) subtracting the first and second number of oscillation periods counted to determine a count difference; (f) wherein count difference is indicative of true oscillator frequency deviation resulting from movement of the object; and (g) determining relative movement of the object from the true oscillator frequency deviation.

25. The method of any preceding embodiment, further comprising generating a pixel movement output based on said true oscillator frequency deviation for controlling a visual display.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Comparing Touch Sensor Approaches

|  | K-D, Kim ISSCC12 [5] | Y.Z, Hu ISSCC14 [2] |
|---|---|---|
| Sensing Type and Format | 2D Mobile | 3D Large Screen |
| Cancel Environmental Drift Effect | No | No |
| External Component Required | No | Yes (33 uH inductor) |
| Electrode Size | X | 10 mm × 400 mm |
| Electrode Spacing+ | X | 100 mm |
| Normalized Sensing Height (Height/Panel Area) | 0 | 0.018 $cm^{-1}$ (30 cm/(40 cm × 40 cm)) |

TABLE 1-continued

Comparing Touch Sensor Approaches

| | | |
|---|---|---|
| Height Resolution | X | 10 mm |
| | | (Screen Size: 40 cm × 40 cm) |
| SNR | 35 dB @ 0 cm | 50 dB @ 5 cm |
| | | 30 dB @16 cm |
| Power Consumption | 10.6 mW | 19 mW |
| Die Area | 6.87 mm$^2$ | 4.2 mm$^2$ |
| Channel | 30 | 8 |
| Scan Frequency | 120 Hz | 240 Hz |
| Technology | 1.5/5.5/30 V | 1.2/2.5 V |
| | 90 nmLDI | 130 nm CMOS |

| | Microchip MGC3130 [3] | This Work |
|---|---|---|
| Sensing Type and Format | 3D Large Screen | 3D Mobile |
| Cancel Environmental Drift Effect | No | Yes |
| External Component Required | No | No |
| Electrode Size | 79 mm × 118 mm | 4.8 mm × 72 mm |
| | | (Standard HTC3.4" Screen) |
| Electrode Spacing+ | 48 mm | 4.8 mm |
| Normalized Sensing Height (Height/Panel Area) | 0.1 cm$^{-1}$ (15 cm/(14.8 cm × 9.9 cm)) | 0.32 cm$^{-1}$ (11 cm/(7.2 cm × 4.8 cm)) |
| Height Resolution | X | 10 mm |
| | | (Screen size: 7.2 cm × 4.8 cm) |
| SNR | X | 36 dB @ 1 cm* |
| | | 25 dB @ 5 cm |
| Power Consumption | 150 mW | 2.3 mW |
| Die Area | X | 2 mm$^2$ |
| Channel | 5 | 7 |
| Scan Frequency | 200 Hz | up to 250 Hz@10 MHz sensing |
| Technology | X | 1 V |
| | | 65 nm CMOS |

+Electrode Spacing is distance between two nearby RX Electrodes measured from center to center.
*SNR is measured with actual finger on top of the screen

TABLE 2

Parameters of Non-Contact Position Sensing

| Test Result | Min | Typical | Max |
|---|---|---|---|
| Power Supply Voltage | 0.8 | 1 | 1.2 |
| Current Consumption | 6 mA | 28 mA | 40 mA |
| Oscillator Frequency Range | 100 KHz | 40 MHz | 150 MHz |

TABLE 3

Finger Distance vs. Frequency Shift at 60 MHz

| Finger Distance to Antenna | Frequency Shift |
|---|---|
| 0 | 8 MHz |
| 1 mm | 2.5 MHz |
| 5 mm | 0.5 MHz |

What is claimed is:

1. A non-contact position and motion sensing apparatus, comprising:
   multiple sensor channels;
   an oscillator circuit configured for being separately connected to each channel of said multiple sensor channels while performing non-contact sensing;
   a counter circuit configured for counting oscillator periods over an integration time window and outputting a binary count value as an estimation of the frequency output of said oscillator;
   a count storage and comparison circuit, coupled to said counter circuit, and configured for performing a calibration in which maximum load placed on said oscillator from a sensor channel is determined from said multiple sensor channels, and a capacitive loading is determined for each other channel to equalize loading during non-contact sensing operation; and
   a bootstrap circuit coupled to each of said multiple sensor channels and configured for sensing time-domain voltage of an active channel in said multiple sensor channels and replicating it on remaining non-active channels during non-contact sensing to nullify capacitive coupling with the active channel in response to enforcing equal potentials across inter-channel coupling;
   wherein during operation for non-contact sensing, selected channels are connected to said oscillator with position and motion being determined in response to frequency changes of said oscillator determined with respect to a reference capacitive load, and wherein both equalization of loading performed in response to loading calibration, and nullifying capacitive coupling between channels, increases sensor channel measurement accuracy.

2. The apparatus as recited in claim 1, wherein said count storage and comparison circuit comprises:
   a demultiplexer receiving the binary count value from said counter and passing this to either a first or second data storage register in response to receiving a selector signal;
   a difference circuit configured for generating a binary output value based on the difference between data outputs from said first data storage register and said second data storage register, so that maximum load is found in a process of loading the second data storage register with a new binary count value that is lower than the value previously stored in said second data storage register, and after performing the calibration across all sensor channels the second data storage register represents maximum load on any channel; and a capacitor array coupled as a load to said oscillator, said capacitor array having multiple capacitors, each of which is selected for connection to said oscillator;

wherein during calibration an amount of equalization capacitance is determined and stored for each sensor channel toward matching the maximum load;

wherein during operation in performing non-contact position and motion sensing the stored equalization capacitance is applied from the capacitor array to said oscillator.

3. The apparatus as recited in claim 1, wherein said count storage and comparison circuit includes multiple data registers or memory, into which capacitor selection data is stored for equalizing loading for each channel.

4. The apparatus as recited in claim 1, wherein said bootstrap circuit comprises a unity gain amplifier coupled to an input of said oscillator, and a separate switch coupling output from said unity gain amplifier to each of said sensor channels, so that oscillator input voltage from the active sensor channel is coupled through the switches to the inactive sensor channels to equalize voltage potentials between channels.

5. The apparatus as recited in claim 1, further comprising at least one buffer coupled between said oscillator and said counter circuit.

6. The apparatus as recited in claim 1, wherein said oscillator comprises an inverter-based active resonator, a ring oscillator, or an inductor-capacitor (LC) oscillator.

7. The apparatus as recited in claim 1, wherein said oscillator frequency is in the range from 100 MHz to 100 GHz.

8. The apparatus as recited in claim 1, wherein each of said multiple sensor channels is configured for coupling to a sensor proximal, a display screen, or touch screen display.

9. The apparatus as recited in claim 1, wherein said apparatus is configured for implementation with discrete electronics, integrated electronics (on-chip), or a combination of discrete and integrated electronics.

10. A method of performing non-contact sensing of nearby position and motion, comprising:

performing a calibration process for multiple sensor channels coupled to an oscillator, in which maximum load on said oscillator for any of these sensor channels is determined, and a capacitive load determined for each other channel to bring it to the same maximum load when operating to perform non-contact sensing;

bootstrapping each of said multiple sensor channels to sense time-domain voltage on an active channel and replicate it on remaining non-active channels during non-contact sensing to nullify capacitive coupling with the active channel in response to enforcing equal potentials across inter-channel coupling; and performing non-contact sensing of position and motion by measuring and correlating oscillator frequency changes on each of said multiple channels, whereas the calibration and bootstrapping steps result in increasing accuracy of the non-contact sensing.

11. The method as recited in claim 10, wherein each of said multiple sensor channels is configured for coupling to a sensor proximal a display screen, or touch screen display.

12. The method as recited in claim 10, wherein said method is configured for implementation with discrete electronics, integrated electronics, or a combination of discrete and integrated electronics.

13. The method as recited in claim 10, wherein said calibration process comprises sequencing through each of the multiple sensor channels during a first phase of calibration to determine which sensor channel presents the highest load upon the oscillator, as well as sequencing through each of the multiple sensor channels during a second phase of calibration to determine the amount of capacitance required to bring each of the other sensor channels to match this highest load.

* * * * *